United States Patent
Gianchandani et al.

(10) Patent No.: US 10,794,374 B2
(45) Date of Patent: Oct. 6, 2020

(54) MICROFABRICATED GAS FLOW STRUCTURE

(71) Applicant: The Regents of the University of Michigan, Ann Arbor, MI (US)

(72) Inventors: Yogesh Gianchandani, Ann Arbor, MI (US); Seungdo An, Portland, OR (US); Yutao Qin, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 512 days.

(21) Appl. No.: 15/006,034

(22) Filed: Jan. 25, 2016

(65) Prior Publication Data

US 2016/0230751 A1 Aug. 11, 2016

Related U.S. Application Data

(60) Provisional application No. 62/107,461, filed on Jan. 25, 2015.

(51) Int. Cl.
| | |
|---|---|
| *F04B 37/06* | (2006.01) |
| *C23C 16/455* | (2006.01) |
| *F04B 19/24* | (2006.01) |
| *B81C 1/00* | (2006.01) |
| *F04B 19/00* | (2006.01) |

(52) U.S. Cl.
CPC .......... *F04B 37/06* (2013.01); *B81C 1/00063* (2013.01); *B81C 1/00071* (2013.01);
(Continued)

(58) Field of Classification Search
CPC ........ F04B 37/06; F04B 19/006; F04B 19/24; B81C 1/00603; B81C 1/0047;
(Continued)

(56) References Cited

U.S. PATENT DOCUMENTS

| | | | |
|---|---|---|---|
| 6,225,140 B1 * | 5/2001 | Liu | G01L 9/0042 438/48 |
| 6,533,554 B1 * | 3/2003 | Vargo | F04B 19/006 417/207 |

(Continued)

FOREIGN PATENT DOCUMENTS

WO WO 2012144932 A2 * 10/2012 ............. F04B 19/24

OTHER PUBLICATIONS

English Translation of WO 2012/144932 A2 Obtained Feb. 1, 2018.*

*Primary Examiner* — Connor J Tremarche
(74) *Attorney, Agent, or Firm* — Reising Ethington P.C.

(57) ABSTRACT

A microfabricated gas flow structure includes an array of vertical gas flow channels in a side-by-side parallel flow arrangement. Adjacent gas flow channels are separated by a thin wall having a thickness which can be an order of magnitude or more less than the channel width, offering exceptionally high area efficiency for the array. Channel walls can be formed from a dielectric material to provide the walls with sufficient integrity at nanoscale thicknesses and to provide thermal insulative properties in the lateral direction, thereby controlling power losses when the gas flow structure is employed as a Knudsen pump. The gas flow structure can be microfabricated as a monolithic structure from an SOI wafer, with the gas flow channels formed in the device layer and the heat sink formed from the handle layer.

19 Claims, 17 Drawing Sheets

(52) U.S. Cl.
CPC ........ *C23C 16/45555* (2013.01); *F04B 19/24* (2013.01); *B81C 1/00603* (2013.01); *B81C 1/00801* (2013.01); *F04B 19/006* (2013.01)

(58) Field of Classification Search
CPC ... B81C 1/0055; B81C 1/0063; B81C 1/0071; B81C 1/0079; B81C 1/00214; B81C 1/00388; B81C 1/00404; B81C 1/00476; B81C 1/00428; B81C 1/00531; B81C 1/00595; B81C 2201/0109; B81C 1/00801; B81C 2201/0132; B81C 2201/0142; B81C 2201/0156; C23C 16/45555; H01L 30/65
USPC .......... 417/207; 438/42, 689, 706, 734, 735, 438/695, 696
See application file for complete search history.

(56) References Cited

U.S. PATENT DOCUMENTS

| | | | |
|---|---|---|---|
| 7,980,828 B1* | 7/2011 | Lantz | F04B 19/24 417/207 |
| 8,235,675 B2* | 8/2012 | Gianchandani | F04B 19/24 417/51 |
| 2012/0207625 A1* | 8/2012 | McNamara | F04B 19/24 417/207 |
| 2013/0147021 A1* | 6/2013 | Puurunen | B81C 1/00801 257/635 |
| 2013/0153763 A1* | 6/2013 | Saint | F04B 19/006 250/288 |
| 2013/0267049 A1* | 10/2013 | Robert | B81C 1/00134 438/22 |

* cited by examiner

FIG. 10A
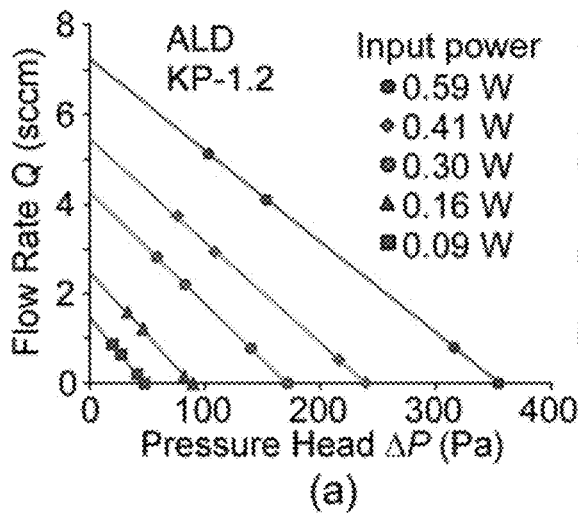
(a)
FIG. 10B
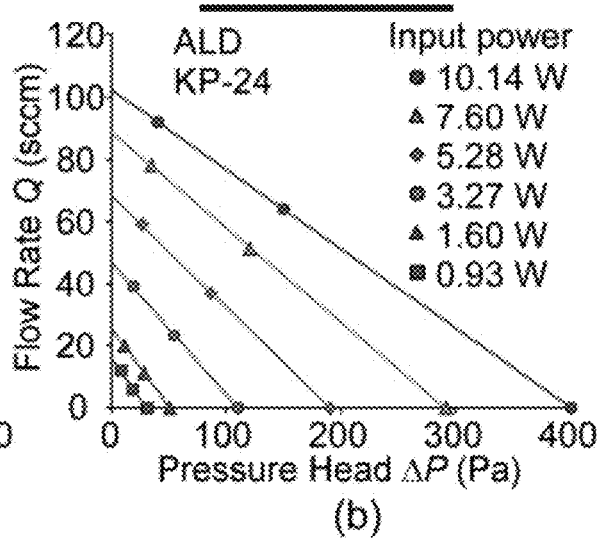
(b)
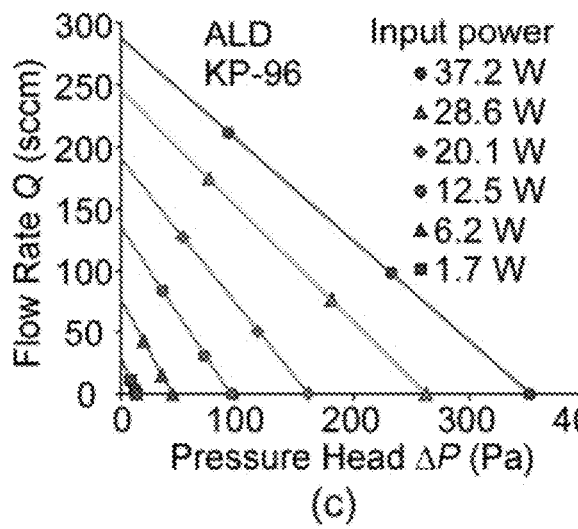
(c)
FIG. 10C
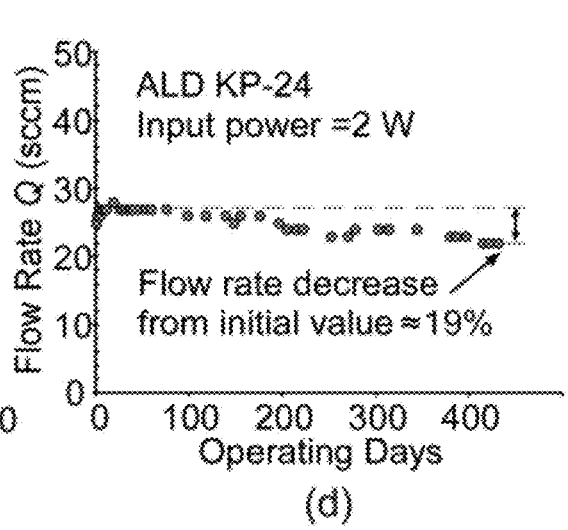
(d)
FIG. 10D

(a)

(b)

(c)

(d)

MICROFABRICATED GAS FLOW STRUCTURE

TECHNICAL FIELD

The present disclosure relates generally to microfabricated gas flow structures, such as Knudsen pumps.

BACKGROUND

Gas pumping has been demonstrated by micropumps decades ago. Most gas micropumps operate via actuation of a flexible diaphragm to generate gas flow. Diaphragm actuation mechanisms include electrostatic, piezoelectric, and electromagnetic actuation. Diaphragm pumps are relatively energy efficient, but cyclic stress and fatigue in the diaphragm can lead to diaphragm failure over time.

A Knudsen pump is another type of gas micropump that operates via thermal transpiration with no moving parts, resulting in a much longer lifetime. When two volumes are connected by a channel that has a hydraulic diameter that is comparable to or smaller than the mean free path of the gas molecules at the relevant pressure (i.e., Kn≥0.1), the gas flow is in the transition or free molecular regime. Under these conditions, gas molecules flow from the cold end to the hot end of the narrow channel.

Knudsen micropumps can employ microfabricated channels or porous media. Thermal transpiration channels lithographically microfabricated in-plane on silicon substrates can form pumps intended to evacuate blind cavities. A multistage Knudsen pump with this configuration can achieve a vacuum pressure of 0.9 Torr at atmospheric ambient pressure, but its flow rate is limited by the resistance of single flow channels connected in a long series. In contrast, porous media can provide numerous nano/micro channels which permit high flow. Various porous media, such as silicon aerogel, glass microspheres, naturally occurring zeolite, and mixed cellulose ester (MCE) membranes may used. An MCE-based Knudsen pump can generate an air flow rate of about 1 sccm, which is sufficient for some micro gas chromatography systems to provide gas flow for vapor separation. The use of porous media presents a low-cost option and represents a facile approach to Knudsen pumps, but material defects in the media can limit the flow rate. In addition, assembly of porous media into conventionally machined or lithographically fabricated frames can pose challenges to process integration.

SUMMARY

In accordance with one or more embodiments, a method of microfabricating a gas flow structure includes the steps of: (a) providing a substrate having a planar surface; (b) forming an array of gas flow channels into the substrate, each gas flow channel extending between an inlet end and an outlet end in a direction normal to the planar surface, wherein adjacent gas flow channels of the array are separated by a layer of dielectric material; (c) forming a first support layer from the substrate at the inlet end of the channels; and (d) forming a second support layer at the outlet end of the gas flow channels so that the array of gas flow channels is supported between the first and second support layers.

In accordance with one or more embodiments, a microfabricated gas flow structure includes a first support layer at an inlet side of the structure, a second support layer at an outlet side of the structure, and an array of gas flow channels located between the first support layer and the second support layer. The first support layer includes a plurality of gas inlet openings formed therethrough, and the second support layer includes a plurality of gas outlet openings formed therethrough. The array of gas flow channels fluidly connects the gas inlet openings with the gas outlet openings, and the gas flow channels of the array are in a parallel flow arrangement. Each gas flow channel of the array is separated from an adjacent gas flow channel of the array by a wall. Each wall extends between an inlet end at the first support layer and an outlet end at the second support layer, and each gas flow channel of the array is sized for flow in the non-viscous flow regime in a flow direction between the inlet side and the outlet side of the structure.

BRIEF DESCRIPTION OF THE DRAWINGS

Illustrative embodiments will hereinafter be described in conjunction with the appended drawings, wherein:

FIGS. 10A-10D illustrate experimental results on the air flow rate (Q) and pressure head (ΔP) created by fabricated Knudsen pumps (a) ALD KP-1.2, (b) ALD KP-24, and (c) ALD KP-96 while operating near atmospheric pressure at various input powers, as well as (d) a lifetime test on model ALD KP-24, where ΔP=Po−Pi and Po and Pi are the respective pressures at the outlet and inlet sides of the Knudsen pump;

DESCRIPTION OF THE ILLUSTRATED EMBODIMENTS

Described below is a gas flow structure and a method of microfabricating it. The gas flow structure is operable as a high flow Knudsen pump with properly sized gas flow channels and applied temperature differential. The microfabricated gas flow structure may be useful in other applications as well, such as filtration or other applications. Gas flow can be induced through the gas flow structure from an inlet side at one temperature to an outlet side at a higher temperature via free-molecular flow without moving parts. The gas flow structure may include gas flow channels that are densely arrayed, vertically oriented (with respect to the fabrication process), and/or rectangular and capable of providing high flow rates relative to known structures. The gas flow channels, or thermal transpiration channels, can be microfabricated and have uniform and controllable dimensions, minimizing the possibility of back flow permitted by defects. Vertically oriented channels permit dense integration of numerous channels capable of pumping in parallel.

The gas flow structure can be made to include a heat source, such as a thin film resistive heater, and a heat sink, such as a gridded silicon (Si) heat sink, across which a temperature gradient is provided for operation as a Knudsen pump. The Knudsen pump can be fabricated on a single silicon-on-insulator (SOI) wafer using a lithographic process and can be fabricated as a monolithic structure. Sidewalls of the channels can be formed by atomic layer deposition (ALD) of a layer of dielectric material such as $Al_2O_3$ on sacrificial Si trench walls and subsequent Si etching. Functional Knudsen pumps have been designed and fabricated with footprints ranging from 0.4 cm² to 3.2 cm². At atmospheric pressure, the fabricated pumps can provide a maximum measured air flow rate of greater than 200 sccm with a response time of less than 0.5 seconds. Experimental results have also shown that the fabricated pumps are particularly suitable for pumping at a moderate vacuum pressure of about 200 Torr.

Figure 1:
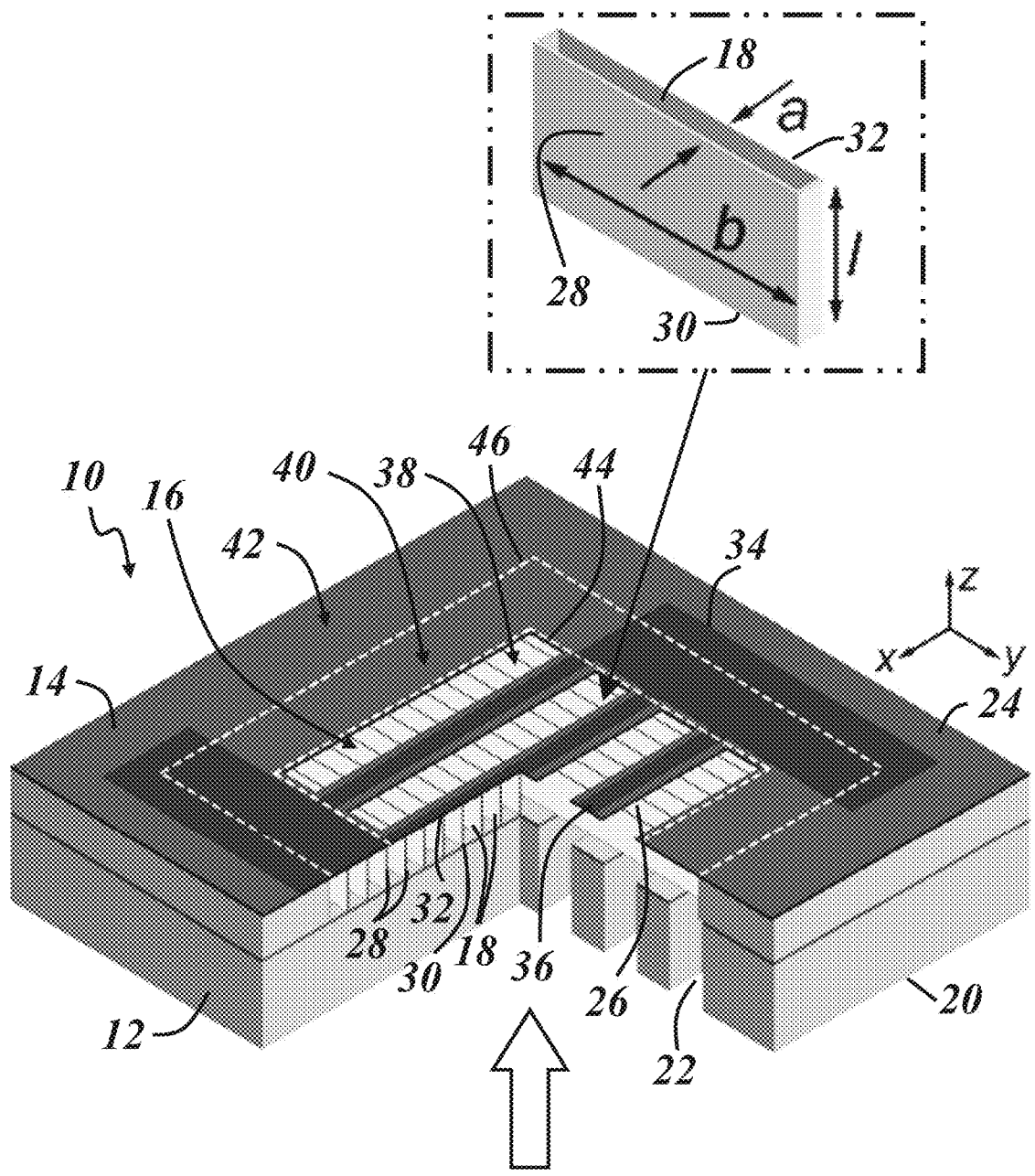
FIG. 1 is an isometric cutaway view of an illustrative gas flow structure in the form of a Knudsen pump.

FIG. 1 is a cutaway view of an example of a gas flow structure 10 in the form of a high flow Knudsen pump. The structure 10 includes a first support layer 12, a second support layer 14, and an array 16 of gas flow channels 18 located between the support layers. The first support layer 12 is located at an inlet side 20 of the structure 10 and includes a plurality of gas inlet openings 22 formed therethrough. In one embodiment, the gas inlet openings 22 are formed along the first support layer 12 in a grid pattern. The second support layer 14 is located at an outlet side 24 of the structure 10 and includes a plurality of gas outlet openings 26 formed therethrough. In this example, the gas outlet openings 26 are rectangular with the elongate direction oriented transverse to the elongate direction of the cross-sections of the gas flow channels 18. The second support layer 14 can be fabricated from a dielectric material and may be referred to as an upper dielectric membrane.

The array 16 of gas flow channels 18 fluidly connects the gas inlet openings 22 with the gas outlet openings 26. The gas flow channels 18 of the illustrated array 16 are arranged side-by-side in a parallel flow arrangement. Each gas flow channel 18 of the array 16 is separated from adjacent gas flow channels by a relatively thin wall 28. Each 28 wall extends between an inlet end 30 at the first support layer 12 and an outlet end 32 at the second support layer 14, and each gas flow channel 18 of the array 16 is sized for flow in the non-viscous flow regime in a flow direction A between the inlet side 20 and the outlet side 24 of the structure 10. In the example of FIG. 1, the flow direction A is aligned with the z-axis of the illustrated x-y-z reference frame. The illustrated channel walls 28 may be referred to as vertical walls 28, which is a reference to their orientation with respect to a horizontal wafer surface that may be used in the fabrication process. When in use, the channels 18 may be arranged in any vertical or non-vertical orientation.

The illustrated structure 10 also includes a heat source 34 supported by the second support layer 14 at the outlet side 24 of the structure. The heat source 34 is operable to induce gas flow through the array 16 of gas flow channels 18 such that the gas flow structure 10 operates as a Knudsen pump. The particularly illustrated heat source 34 is in the form of a thin film resistive heater with resistive portions 36 of the heater arranged along the second support layer 14 between adjacent gas outlet openings 26. The heat source 34 can thus be fabricated as an integral part of the gas flow structure as shown, but may also be separately provided. During operation as a Knudsen pump, the first support layer 12 of the illustrated structure operates as a heat sink.

Enabled by the microfabrication techniques described herein and by proper material selection, the walls 28 that define the perimeter of each gas flow channel 18 are very thin and allow for exceptionally high area efficiency of the array 16 and of the overall structure 10. A single gas flow channel 18 and its surrounding wall 28 is illustrated in the inset of FIG. 1 superimposed as if removed from the structure 10. The illustrated channels 18 have an elongated rectangular cross-section with a short side defining a channel width a and a long side defining a channel depth b. The channel length l is the distance between the inlet and outlet ends 30, 32 of the walls 28. The channel width a limits the effective hydraulic diameter to approximately this value and may be selected for pumping efficacy in the range of 0.1-1 atmosphere pressure and for ease of lithographic patterning.

Each wall 28 may range in thickness from about 10 nm to about 100 nm. These very thin walls 28 allow for the array 16 to have an area efficiency of over 90% even when the distance between opposite flow channel walls is sufficiently small that gas flow through the channels is in the non-viscous flow regime. In some cases, the wall thickness of the walls 28 is an order of magnitude less than the distance between opposite flow channel walls. Arrays 16 of gas flow channels 18 have been successfully fabricated as described below with an area efficiency of over 99%. Area efficiency of the array 16 is defined at a cross-section taken through the array along the length of the gas flow channels 18 between the inlet and outlet ends 30, 32 and is equal to the percentage of the total cross-sectional area that is open area—i.e., not occupied by the thin walls 28.

The illustrated gas flow structure 10 can be divided into three areal regions, including an active pumping area 38, a thermal isolation zone 40, and an outer rim 42. The gas outlet openings 26 lie entirely within the active pumping area 38. The thermal isolation zone 40 circumscribes the active pumping area 38, and the outer rim 42 circumscribes the thermal isolation zone. In this example, the array 16 of gas flow channels 18 lies entirely within the thermal isolation zone 40. In particular, with a rectangular array 16 as illustrated, the active pumping area 38 is defined within a perimeter 44 that lies along outer edges of the outlet openings 26, and the thermal isolation zone 40 is defined within a perimeter 46 of the array. In this arrangement, the entire thermal isolation zone 40 is occupied by gas flow channels 18 of the array 16 such that gas flow channels at an outer portion of the array are at least partially blocked by the second support layer 14 in the thermal isolation zone. The thermal isolation zone 40 can provide lateral thermal isolation between the active pumping area 38 and the outer rim 42, thus minimizing lateral power dissipation which does not contribute to pumping.

An area efficiency can be determined at the outlet side 24 of the structure 10 as a percentage of the active pumping area 38 that is open area—i.e., not occupied by solid portions of the second support layer 14 or walls 28. This area efficiency can be made at 20% or higher and is limited only by the amount of structure necessary at the second support layer 14 to effectively support the outlet ends 32 of the walls to maintain internal channel dimensions. Working examples have been fabricated with an area efficiency of 30% at the outlet side 24 of the structure, and higher area efficiencies are possible up to and above 50%.

The illustrated first support layer 12 with gas inlet openings 22 may function as a heat sink by dissipating Joule heat laterally (i.e., parallel to the x-y plane) to the outer rim 42, which is generally more massive than the portion of the heat sink in the active pumping area 38 and thermal isolation zone 40 where the gas inlet openings are formed. The outer rim 42 can be used for physical handling as well as for attachment of the gas flow structure 10 to external components.

The channel walls 28 may be fabricated from a material having mechanical properties sufficient to maintain the integrity of the walls when the wall thickness is on the nanoscale so that the walls do not collapse and close off the gas flow channels 18 which they help define. In one embodiment, each wall is fabricated from a layer of dielectric material. The dielectric material offers both suitable rigidity and thermal insulating properties. The thermal insulating properties of the dielectric material facilitate increased pump efficiency by limiting heat dissipation in the lateral direction (i.e., in a direction parallel with the x-y plane of FIG. 1) within the array 16 of flow channels 18. Aluminum oxide ($Al_2O_3$) is one example of a suitable dielectric material.

FIGS. 2A-2F depict an illustrative microfabrication process by which the above—described gas flow structure can be formed. The method generally includes providing a substrate 100 having a planar surface 102, forming the array 16 of gas flow channels 18 into the substrate so that each gas flow channel extends between the inlet end 30 and the outlet end 32 in a direction normal to the planar surface with adjacent gas flow channels of the array separated by a layer of dielectric material in the form of the above described walls 28, forming the first support layer 12 from the substrate at the inlet end of the channels, and forming the second support layer 14 at the outlet end of the gas flow channels so that the array of gas flow channels is supported between the first and second support layers. The illustrated method also includes forming the heat source 34 at the outlet end 32 of the gas flow channels 18 and forming the first support layer 12 as a heat sink. The sequentially performed steps of the illustrated method are described below.

Figure 2:
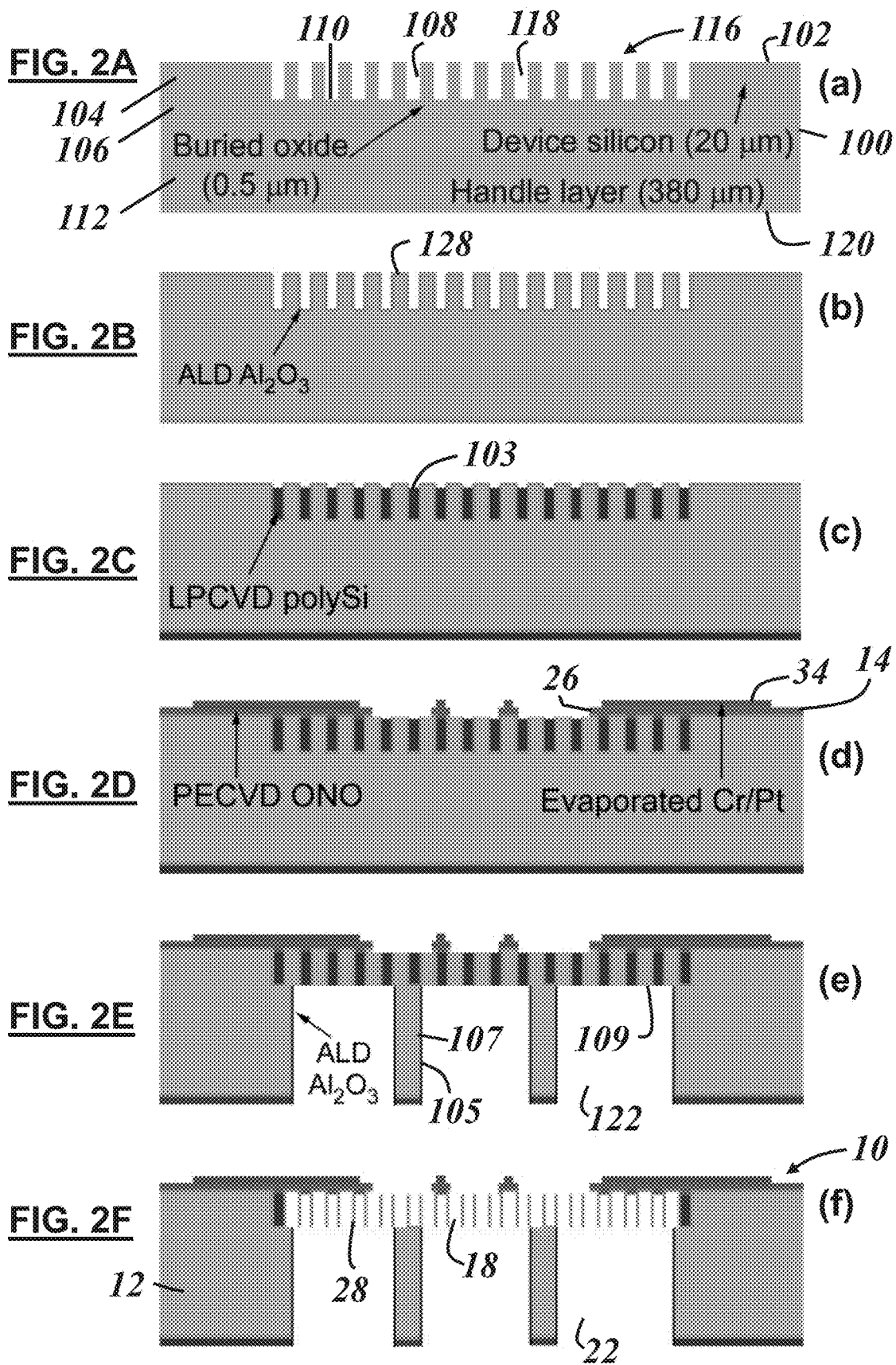
FIGS. 2A-2F depict an illustrative fabrication process for a gas flow structure including: (a) forming trenches in a substrate, (b) coating trench walls with a layer dielectric material, (c) filling the coated trenches with an etchable material, (d) patterning a support layer and a heat source over the open ends of the trenches, (e) forming a heat sink from the substrate, and (f) etching the etchable material from between the layers of dielectric material to form gas flow channels.

In FIG. 2A, the substrate 100 is provided as a silicon-on-insulator (SOI) wafer substrate, including a device layer 104 and a handle layer 112 (which will become the first support layer or heat sink 12) separated by a dielectric layer 106. In the particular example of the SOI substrate, the device and handle layers 104, 112 are silicon layers, and the dielectric layer 106 is an oxide layer (i.e., $SiO_2$), which may be referred to as a buried oxide layer. The handle layer 112 is typically significantly thicker than the device layer 104 in an SOI wafer substrate, as shown. An array 116 of trenches 118 is formed in the substrate surface 102 at the desired locations of the gas flow channels 18. Deep reactive ion etching (DRIE) or other suitable technique can be used to form the trenches 118. Each trench has opposing sidewalls 108 and a bottom wall 110 connecting the opposing sidewalls. In the working examples described herein, the starting SOI wafer substrate has a 20 μm-thick device layer and a 380 μm-thick handle layer separated by 0.5 μm-thick oxide layer, and each trench is formed with a width a=2 μm and a depth b=118 μm with 2 μm spacing between adjacent trenches. The buried oxide layer acts as an etch stop at the bottom wall 110 of each trench 118 so that each trench has a length l=20 μm, which is the starting thickness of the device layer 104 in the working examples described herein.

In FIG. 2B, the opposing sidewalls 108 are coated with a layer 128 of dielectric material that will become the walls 28 of the gas flow channels 18. In the illustrated example, the bottom wall 110 of each trench 118, as well as the remainder of the substrate surface 102, is also coated with the layer of dielectric material. The coating step may be performed via atomic layer deposition (ALD) or other suitable technique. In some of the working examples described herein, the dielectric material is $Al_2O_3$ deposited by ALD at a thickness of about 10 nm. In other working examples described herein, the layer of dielectric material is a silicon oxide-nitride-oxide (ONO) layer deposited at a thickness of about 100 nm. An opposite side 120 of the substrate 100 is also coated with the dielectric material in the illustrated example.

In FIG. 2C, the coated trenches 118 are filled with an etchable material 103 so that the second support layer 14 and heat source 34 can be patterned on the substrate 100 without the patterned materials filling the trenches. The etchable material 103 may be polysilicon or other suitable material deposited by low pressure chemical vapor deposition (LP-CVD) or other suitable process. In the working examples described herein, each coated trench is filled with polysilicon using LPCVD at a thickness of about 1.2 μm. Etchable material deposited over the remaining coated planar surface 102 is removed to fully expose the dielectric material 128. This may be performed by dry etching using an isotropic RIE recipe with high selectivity of the etchable material 103 over the dielectric material 128, or by chemical mechanical polishing (CMP). The opposite side 120 of the substrate 100 is also coated with the etchable material 103 in the illustrated example.

In FIG. 2D, the second support layer 14 and the heat source 34 are sequentially deposited and patterned over the open ends of the trenches 118. The second support layer may be formed from ONO or other suitable material via plasma-enhanced chemical vapor deposition (PECVD) or other suitable process. In the working examples described herein, the second support layer 14 is formed by deposition of two stacks of ONO via PECVD. Each ONO stack includes a nitride layer having a thickness of about 0.7 µm sandwiched between two oxide layers having thicknesses of about 0.4 µm for a total support layer 14 thickness of about 3 µm. Nitride and oxide thicknesses may be adjusted to provide a mild tensile stress level of about 56 MPa for example (see TABLE I). Patterning to form the gas outlet openings 26 may be performed by RIE. The heat source 34 can be deposited by evaporation and patterned by a lift-off process. In the working examples described herein, the heat source is a resistive heater formed from a thin metal film including a layer of chromium (Cr) about 25 nm in thickness and a layer of platinum (Pt) about 100 nm in thickness.

TABLE I

| Layer | Thickness (µm) | Residual stress (MPa) |
| --- | --- | --- |
| SOI device layer/buried oxide/handle layer | 20/0.5/380 | NA |
| polySi | 1.5 | NA |
| Upper dielectric membrane (O/N/O-O/N/O) | 0.4/0.7/0.4-0.4/0.7/0.4 | +56 |
| $Al_2O_3$ | 0.0107 | +304 |
| Cr/Pt | 0.025/0.1 | +967 |

In FIG. 2E a plurality of heat sink channels 122 (which will become the gas inlet openings 22 of the heat sink 12) are formed in the substrate 100 from the opposite side 120 of the substrate. The heat sink channels 122 are formed by micromachining or other suitable technique. In the working examples described herein, the $Al_2O_3$ and poly-Si layers at the opposite side 120 of the substrate 100 are masked and etched via RIE, then the handle layer 112 is etched via DRIE to the buried oxide layer 106. Then, the buried oxide layer 106 is etched through via RIE to remove the bottoms 110 of the coated and filled trenches 118 and expose the etchable material 103 for subsequent etching.

Also shown in FIG. 2E is a dielectric layer 105 along sidewalls 107 of the heat sink channels 122. This dielectric layer 105 protects the heat sink 12 during etch-removal of the etchable material 103 from between the layers 128 of dielectric material in the trenches 118. The dielectric layer 105 can be deposited via ALD or other suitable technique to cover the entire surface exposed at the opposite side 120 of the substrate, including the sidewalls 107 and bottom walls 109 of the heat sink channels 122. In the working examples described herein, the dielectric layer 105 is $Al_2O_3$ deposited via ALD at a thickness of about 10 nm. Subsequently, the dielectric layer 105 can be etched via RIE without masking. This results in the dielectric layer 105 coating only the sidewalls 107 of the heat sink channels 122 as shown in FIG. 2E, as the anisotropic ME has a higher etch rate at the bottom walls 109 than along the sidewalls 107.

The finished gas flow structure 10 is shown in FIG. 2F after the sacrificial Si of the device layer and the poly-Si material 103 are removed by dry etching (e.g., $XeF_2$) to form the array 16 of gas flow channels 18.

Below, various examples are modeled, constructed as working examples of the above-described gas flow structure, and/or evaluated, including a model KP-1.2 having an active pumping area of $1\times1.2$ mm$^2$, a model KP-24 having an active pumping area of $4\times6$ mm$^2$, and a model KP-96 that includes four model KP-24s with a total active pumping area of 96 mm$^2$. Model names are preceded by "ALD" in examples in which the channel walls are formed by ALD of $Al_2O_3$ or by "ONO" in examples in which the channel walls are formed from ONO. All of these particular configurations include a thermal isolation zone having a width of about 0.36 mm surrounding the active pumping area Modeling and Experimental Examples The Knudsen pump is modeled by a two-step approach: 1) finite element analysis (FEA) of the temperature distribution within the Knudsen pump; and 2) semi-analytical computation of the flow and pressure outputs of the Knudsen pump. Due to the vast span of feature sizes (from 10 nm to 1 cm) in the Knudsen pump, the FEA is divided into two parts: lateral temperature distribution over the entire device area (FIG. 3); and vertical temperature distribution within a single gas flow channel (FIG. 4), which provides the effective temperature difference that is actually available for pumping. Only the ALD KP-1.2 is modeled to provide an example of the temperature distribution in the device structure and the resulting performance. Because of the symmetry of the design, only a quarter of the ALD KP-1.2 is modeled.

Figure 3:
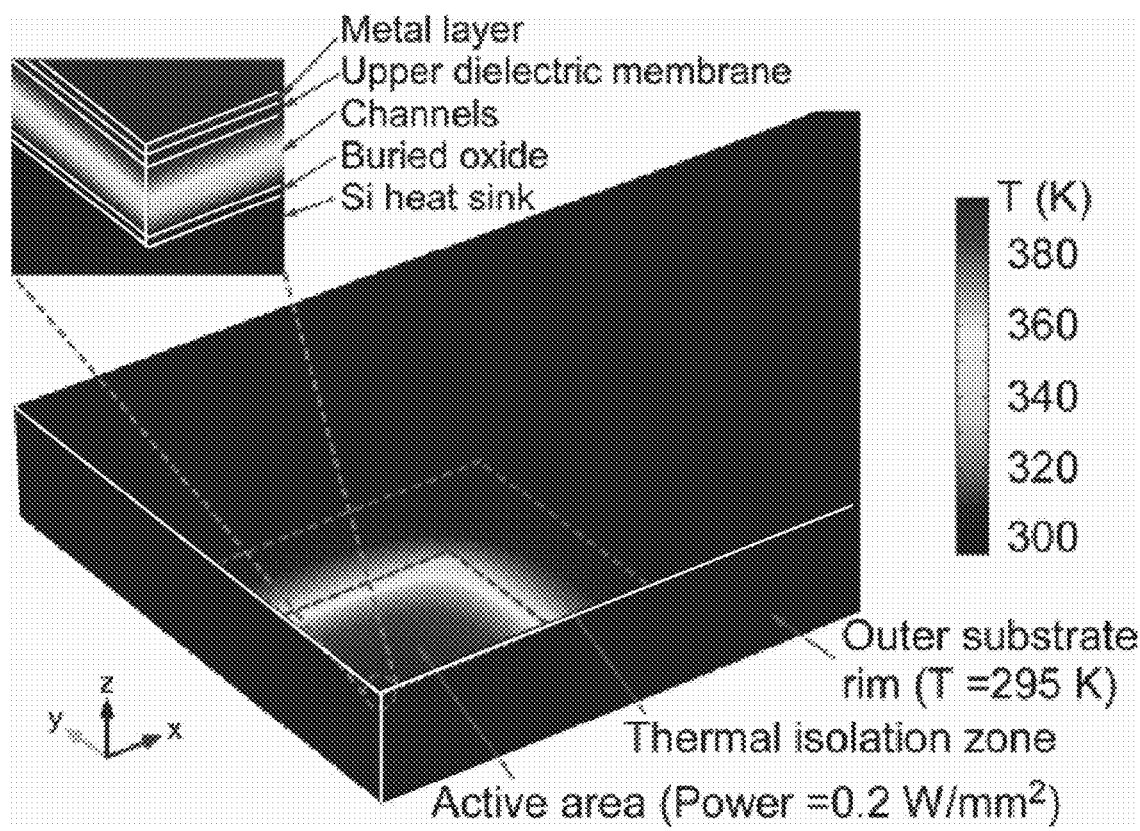
FIG. 3 illustrates results from a FEA of overall temperature distribution in a one quarter model of an illustrative Knudsen pump.

With reference to FIG. 3, the heat sink, the gas flow channels, the upper dielectric membrane, and the heater are modeled as layers of uniform material using equivalent values of thermal conductivities given in Table II, below. For example, the array 16 of gas flow channels is a composite of air and $Al_2O_3$ sidewalls, and is modeled as a layer of uniform material with weighted average thermal conductivity of air and $Al_2O_3$. The thermal conductivity of amorphous thin-film $Al_2O_3$ has been experimentally determined to be 1.8-3.3 W/mK in a 50-600° C. range.

TABLE II

| Structure | Material composition | Thermal conductivity (W/mK) |
| --- | --- | --- |
| Narrow channels | $Al_2O_3$/air | 0.3-0.4, temperature dependent |
| Heat sink | Si/air | 56 |
| Upper ONO membrane | ONO/air | 11 |
| Heater | Cr/Pt/air | 15 |

The bottom of the outer rim 42 is assumed to be maintained at 295 K, which is the ambient temperature during experimental testing. The heater layer is supplied with input power densities (i.e., power per unit pumping area) of 0-0.5 W/mm$^2$. From the temperature distribution in FIG. 3, it is observed that the temperature is highest in the center of the active pumping area 38, and lower in the vicinity of the thermal isolation zone 40. The average temperatures on the top and bottom surfaces of the gas flow channels (i.e., $T_h$ and $T_c$, respectively, which are plotted by the circular-dotted lines in FIG. 5) are used for subsequent calculations. The value of $T_h$ increases from room temperature to 203° C. (476

K) as the input power increases to 0.5 W/mm², whereas $T_c$ increases only to 31° C. (304 K).

Figure 4:
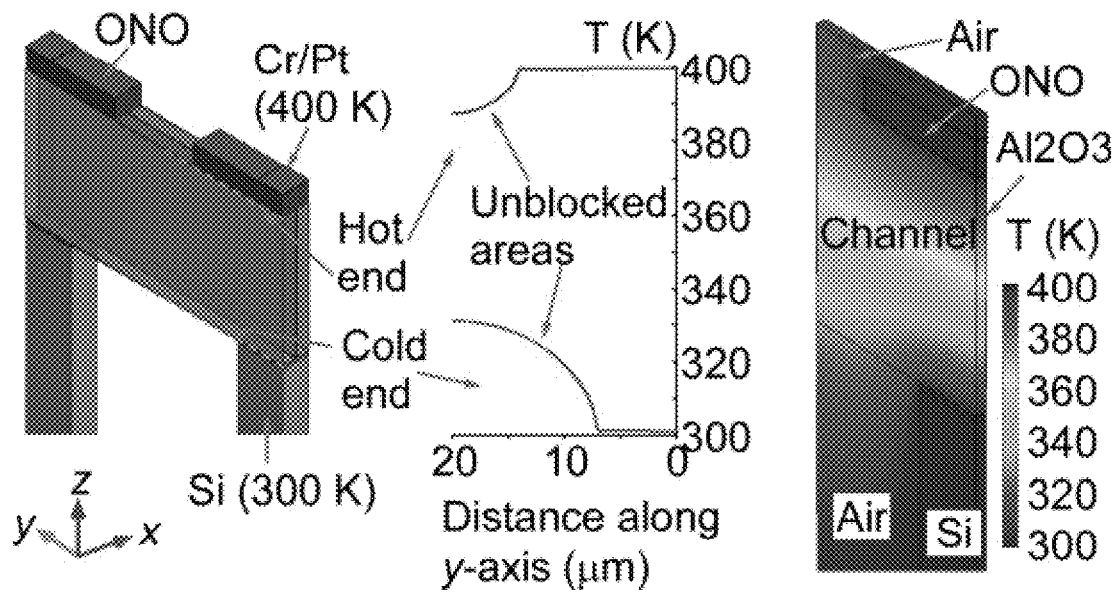
FIG. 4 illustrates results from a FEA of temperature distribution along a gas flow channel of an illustrative Knudsen pump.
Figure 5:
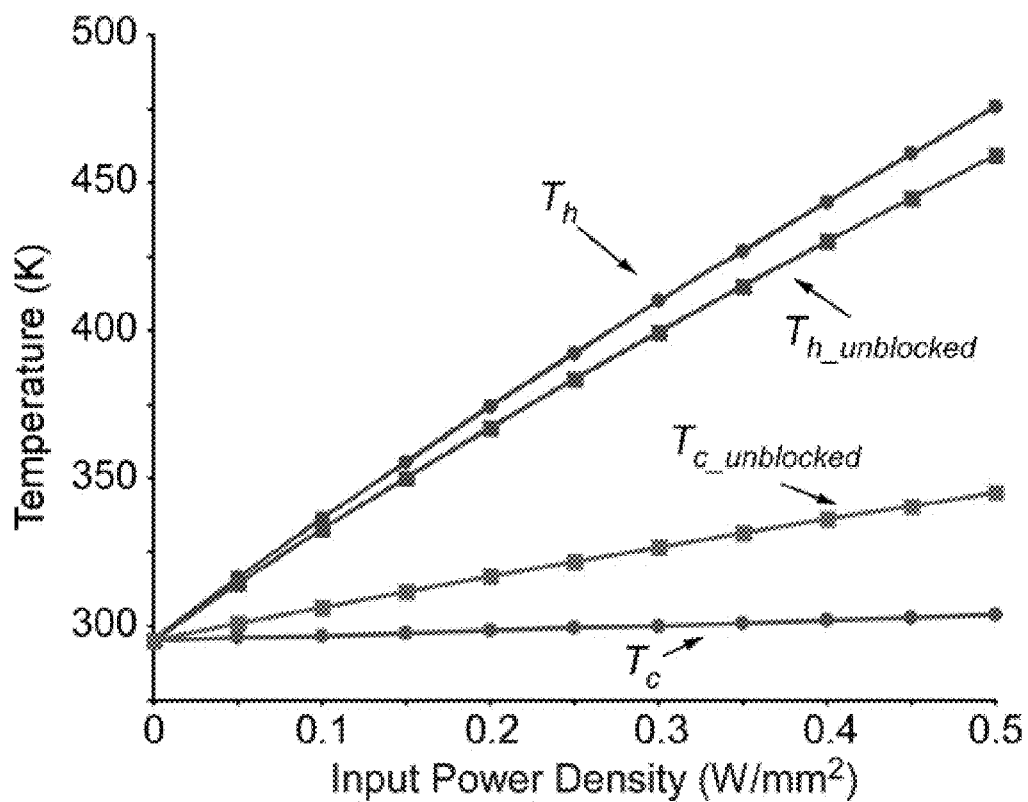
FIG. 5 illustrates predicted temperatures resulting from various input power densities.

With reference to FIG. 4, the hot and cold ends (i.e., the respective output and input ends) of the gas flow channels are partially blocked by the upper dielectric membrane at the output end and by the heat sink at the input end. This part explores the temperatures of the unblocked regions—which are effective for pumping—with respect to the temperatures of the heater and the heat sink. In the simulation of FIG. 4, a temperature difference ($T_h$-$T_c$) of 100 K is applied between the heater and the heat sink. From the simulation results, the average temperature of the unblocked area on the hot end of the gas flow channels ($T_{h\_unblocked}$) is 9.5 K lower than that of the heater (which is $T_h$). The average temperature of the unblocked area on the cold end of the narrow channels ($T_{c\_unblocked}$) is 24.2 K higher than that of the heat sink (which is $T_c$). Consequently, the temperatures effective for pumping with arbitrary $T_h$, $T_c$, and $\Delta T$ can be calculated by:

$$T_{h\_unblocked} = T_h - 9.5\% \times \Delta T \quad (1)$$

$$T_{c\_unblocked} = T_c - 24.2\% \times \Delta T \quad (2)$$

with the results shown in FIG. 5. The nonlinearity in the curves is caused by the temperature dependence of the thermal conductivities of air and $Al_2O_3$.

The flow rate generated by the Knudsen pump is calculated using the temperatures $T_{h\_unblocked}$ and $T_{c\_unblocked}$ as derived above, using the following equation that covers an extended flow regime for Kn≥0.02:

$$M_{std} = \left(Q_T \frac{\Delta T}{T_{avg}} - Q_P \frac{\Delta P}{P_{avg}}\right) \frac{a^2 b P_{avg}}{l} \left(\frac{m}{2 k_B T_{avg}}\right)^{\frac{1}{2}} \quad (3)$$

Here, $M_{std}$ is the standard flow rate through a single rectangular channel; $\Delta T$ ($=T_{h\_unblocked}-T_{c\_unblocked}$), $T_{avg}$ ($=(T_{h\_unblocked}+T_{c\_unblocked})/2$), $\Delta P$, and $P_{avg}$ are the respective temperature difference, average temperature, pressure head, and average pressure between the hot end and the cold end of the channel; a, b, and l are the respective channel width, depth, and length (a≤b, FIG. 1); m is the mass of the gas molecule; $k_B$ is the Boltzmann constant; and $Q_T$ and $Q_P$ are the respective thermal creep and viscous flow coefficients, dependent on the rarefaction parameter $\delta_{avg}$, which is the inverse of Kn.

As the gas flow is partially blocked by the upper dielectric membrane and the heat sink structure, the actual flow is only a fraction of that calculated from Equation (3). The value of this fraction can be represented by percentage of pumping area that is unblocked (f unblocked). In the particular designs described here, $f_{unblocked}$=42.4%.

For comparing the performance of Knudsen pumps with various pumping areas, the output flow rate per unit pumping area ($Q_{u-a}$) is of interest. The output flow rate per pumping area reaches maximum ($Q_{u-a,max}$) when the pressure head is zero, i.e., $Q_{u-a,max}=Q_{u-a|\Delta P=0}$. It can be estimated by the product of Equation (3) and the number of channels per pumping area, divided by the gas density.

The blocking pressure ($\Delta P_{eq}$), which is the maximum pressure head generated by the Knudsen pump at the zero-flow condition, can also be calculated by solving the following equation:

$$\frac{P_{avg} + \Delta P_{eq}/2}{P_{avg} - \Delta P_{eq}/2} = \left(\frac{T_{h\_unblocked}}{T_{c\_unblocked}}\right)^{Q_T/Q_P} \quad (4)$$

Figure 6:
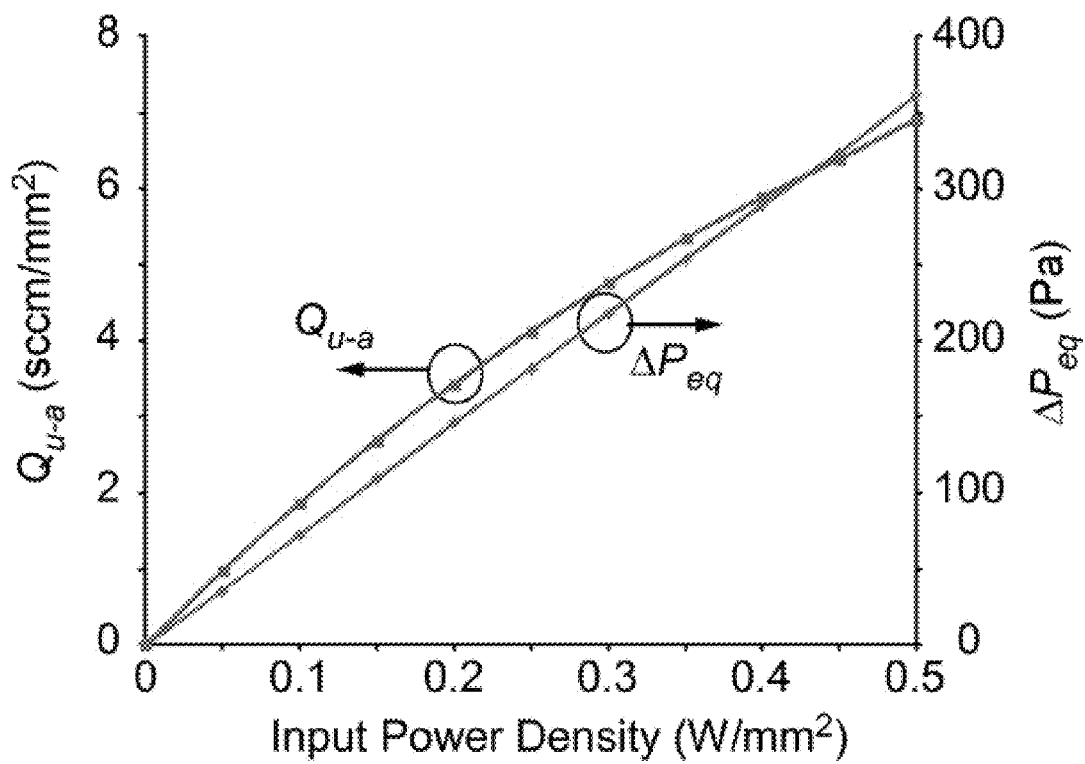
FIG. 6 illustrates predicted flow and pressure resulting from various input power densities.

The calculated blocking pressure is roughly proportional to the input power density (FIG. 6). The calculated maximum flow rate per pumping area shows a concave function to the input power density, which largely results from the increase of average temperature with increasing input power density. The modeled results are compared with the experimental results below.

The experimental working example Knudsen pumps were fabricated by a four mask process in accordance with the process illustrated and described in conjunction with FIGS. 2A-F. The process includes the following features: (1) a SOI device layer mold, formed by trench etching using deep reactive ion etching (DRIE) and conformal refilling using $Al_2O_3$ sidewall material and a polySi sacrificial layer; (2) a Cr/Pt resistive heater on the upper dielectric membrane; and (3) a heat sink formed by DRIE from the SOI handle layer.

Figure 7A:
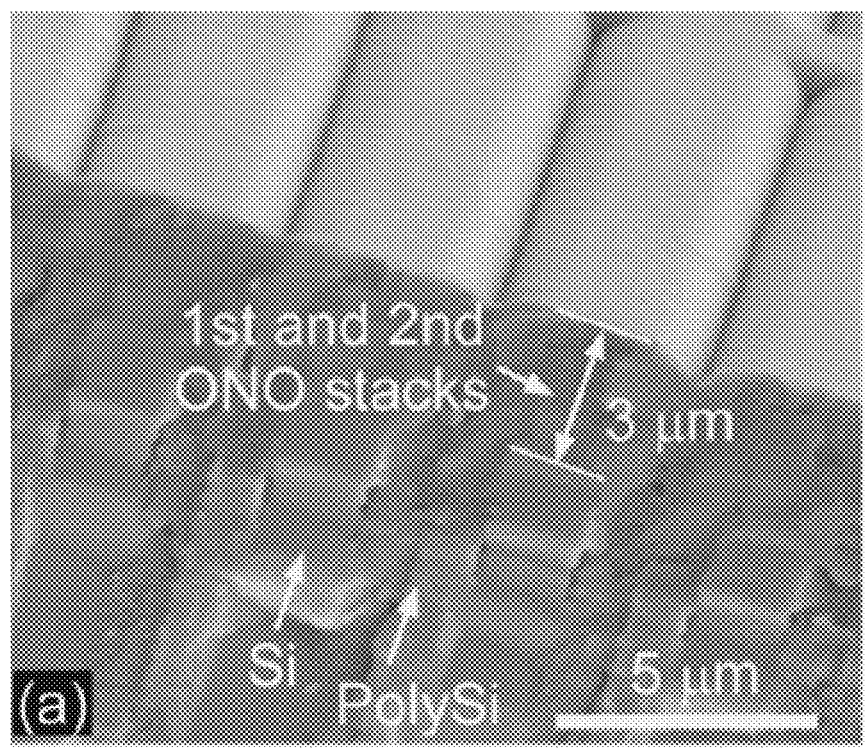
FIGS. 7A-7D are SEM images of illustrative Knudsen pumps during and after fabrication, including: (a) an outlet side of the structure with an ONO support layer, (b) a gridded Si heat sink with $Al_2O_3$-coated sidewalls, (c) the outlet side of the finished structure including the ONO support layer with gas outlet openings and a thin film resistive heater, and (d) a side view of the finished structure.
Figure 7B:
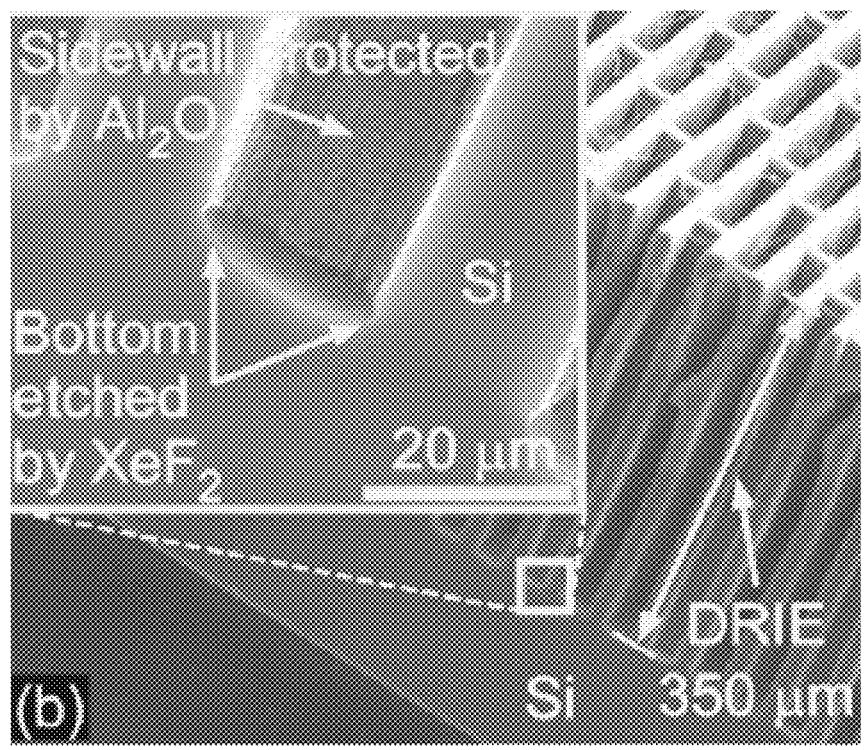

Intermediate and final fabrication results are illustrated by scanning electron microscope (SEM) images in FIGS. 7A-7D. The image in FIG. 7A shows a cross-section of the wafers after deposition of 3 μm PECVD ONO as the upper dielectric membrane (i.e., second support layer). The image in FIG. 7B shows the $Al_2O_3$ layer protection of the sidewalls of the heat sink channels during the $XeF_2$ dry etch step, which was used to etch away the poly-Si filler and the sacrificial Si of the device layer to form the gas flow channels. The bottom of the DRIE trench shows clear undercut profiles, which verifies that the bottom (unprotected by $Al_2O_3$) is etched by $XeF_2$ whereas the sidewall (protected by $Al_2O_3$) is intact.

Figure 7C:
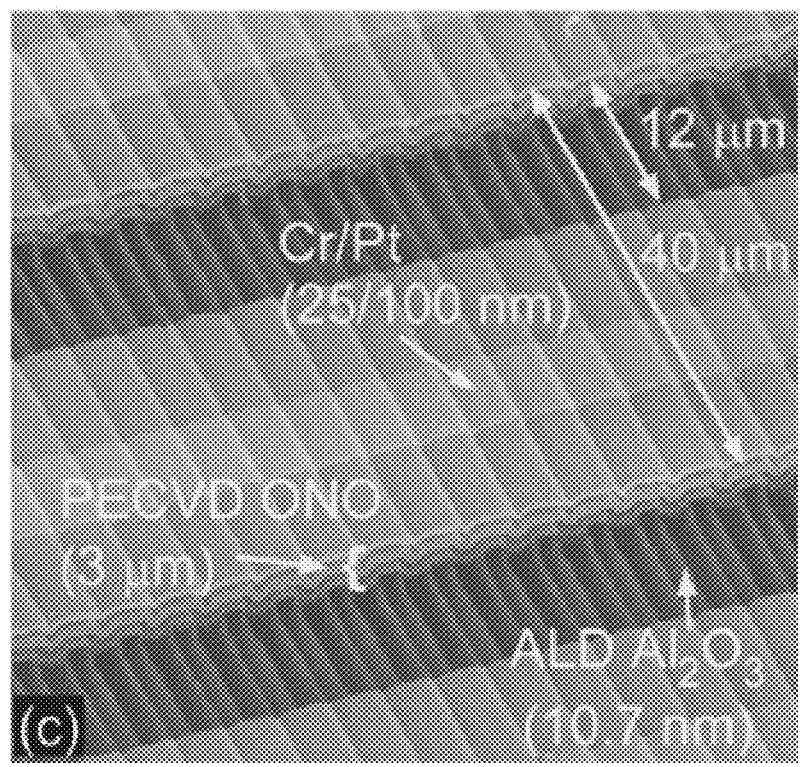
Figure 7D:
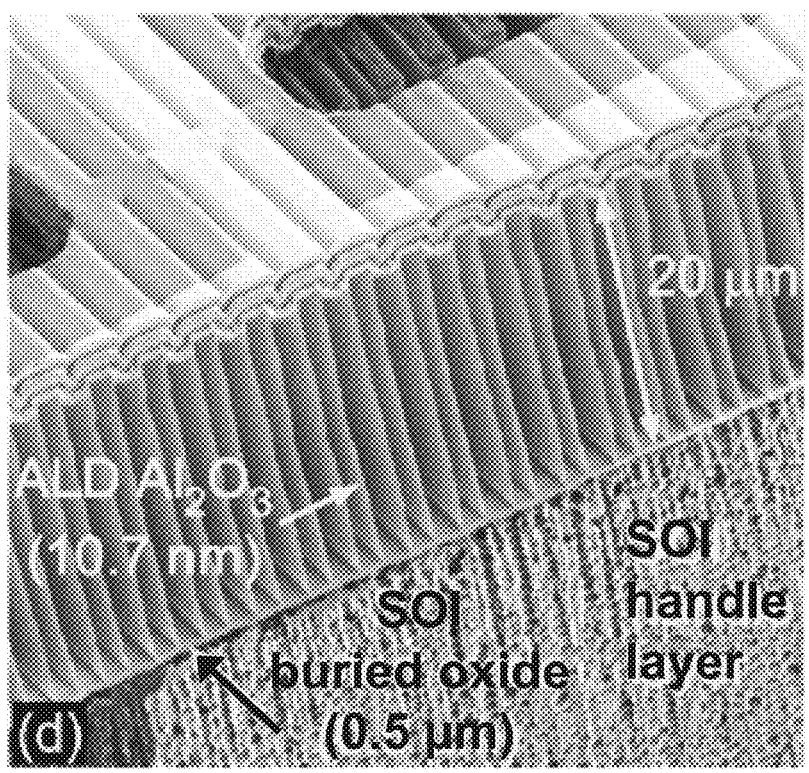

From the SEM images of the final Knudsen pump structure in FIGS. 7C and 7D, it is evident that the $Al_2O_3$, silicon oxide, and Cr/Pt structures remain intact during $XeF_2$ etching and that the silicon nitride is partially etched by $XeF_2$, but the overall structure is not damaged or buckled. Vertical channel sidewalls that are made of 10 nm-thick $Al_2O_3$ show no noticeable defects.

Figure 8A:
FIGS. 8A and 8B are photographs of fabricated Knudsen pumps, including: (a) a model ALD KP-1.2, and (b) a model ALD KP-96, where one-quarter of the ALD KP-96 represents a model ALD KP-24 as shown by the outlines.
Figure 8B:
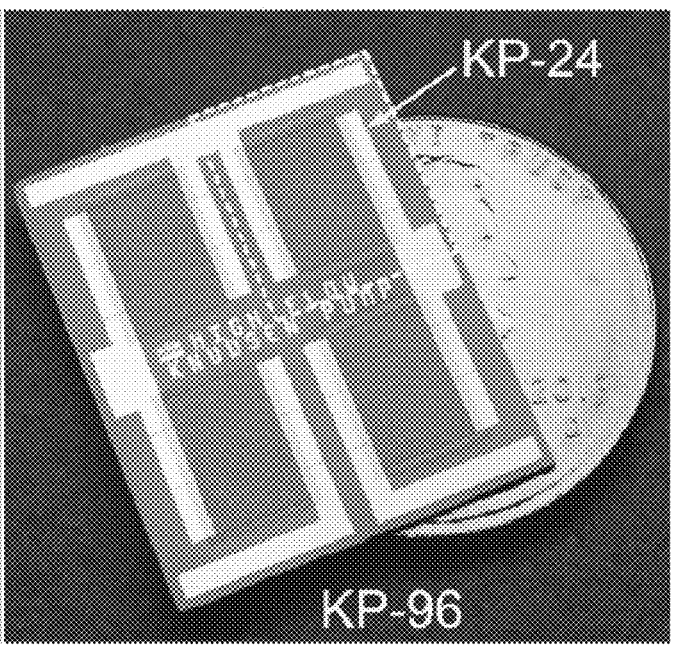

FIGS. 8A and 8B are photographic images of fabricated ALD KPs. The KP-1.2 has a total footprint of 4×10 mm², the KP-24 8×10 mm², and the KP-96 16×20 mm². ONO KPs were microfabricated using a similar process. One difference in the fabrication of the ONO KPs is that the channel sidewalls are formed by LPCVD of a 100 nm-thick ONO layer rather than ALD of a 10 nm-thick $Al_2O_3$ layer.

The performance of the experimental Knudsen pumps operated both at atmospheric pressure and in vacuum was evaluated, using two different test setups. The evaluation involved both steady-state and transient performance at various power levels. A lifetime test was also performed. The pumping medium was room air.

Figure 9A:
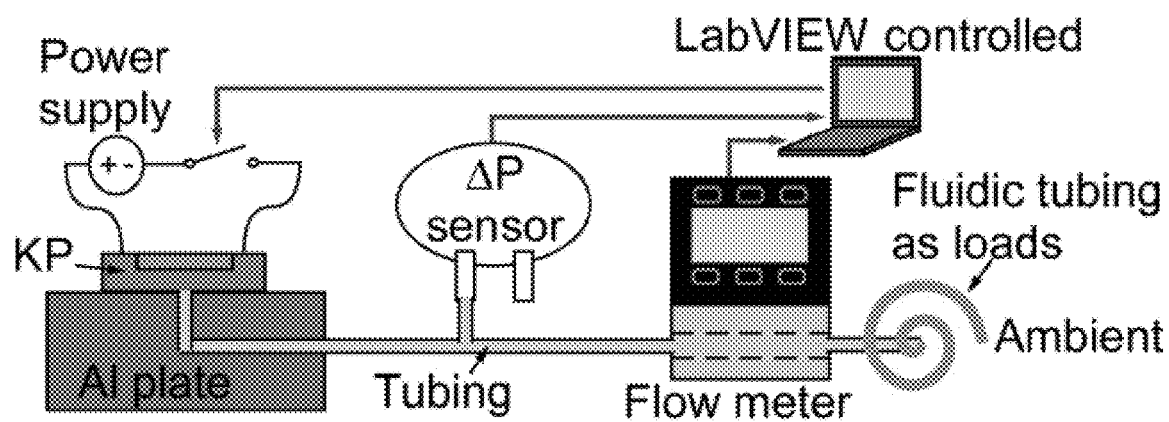
FIG. 9A is a schematic test setup for measuring Knudsen pump operation at atmospheric pressure.

The test setup for evaluating Knudsen pump performance at atmospheric pressure is illustrated schematically in FIG. 9A. The device under test (DUT) was mounted on an Al plate, which served as a thermal ground, with perforations for providing fluidic connection to the gas inlet of the KP. It was ensured that the outer rim of the DUT was in good thermal contact with the Al block, and epoxy was applied around the perimeter to prevent leakage. A computer-controlled switch was used to control the power supplied to the DUT. A commercial pressure sensor (Model # MPX5010DP, Freescale Semiconductor, Inc., Ariz.) and flow meters (Model # MW-20SCCM-D for measuring the KP-1.2, and model # MW-1SLPM-D for measuring the KP-24 and KP-96, Alicat Scientific, Inc., Ariz.) were connected to inlet of the DUT. Tubes with various internal diameters were used to alter flow resistance, and consequently, the load, presented to the DUT.

Knudsen pumps are sometimes operated in tandem with roughing pumps. For example, a roughing pump can be used to drop the pressure of a cavity from atmospheric pressure down to ~100 Torr, with further evacuation to be provided by one or a series of Knudsen pumps. Certain applications like gas chromatography also require continuous flow at modest pressure. Therefore, measuring the Knudsen pump operation in vacuum provides insights into the prospect of such applications.

Figure 9B:
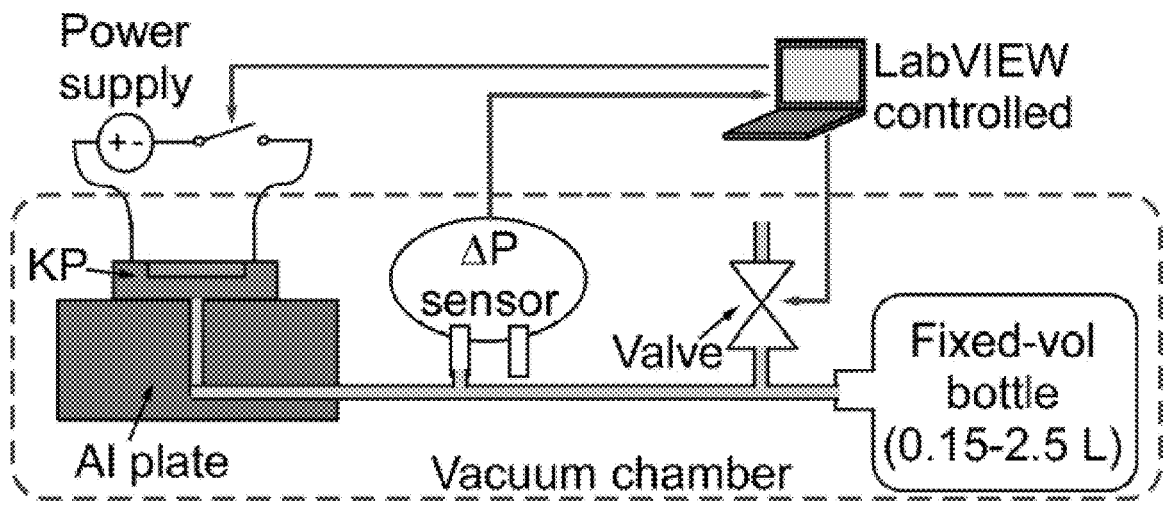
FIG. 9B is a schematic test setup for measuring Knudsen pump operation in vacuum.

For evaluating the DUT operation at low pressure, the entire test setup was placed in a vacuum chamber equipped with electrical feedthroughs for electronic control and readout (FIG. 9B). The DUT was used to evacuate the air in a glass bottle with fixed and known volume. Glass bottles with different volumes were selected in the range of 0.15-2.5 L, depending on the pumping capacity of the DUT. A commercial differential pressure sensor (Model # MPX5010DP, Freescale Semiconductor, Inc., Ariz.) continuously monitored the time-dependent pressure head generated by the Knudsen pumps. The flow rate was calculated from the measured time-dependent pressure variation. A commercial solenoid valve (Model # U8256B045V, ASCO Valve, Inc., N.J.) was used both to reset the pressure head and to bypass the flow before the pressure level in the vacuum chamber stabilized, thereby preventing flow surging through the Knudsen pumps.

The steady-state performance of the ALD KPs operated at atmospheric pressure is shown in FIGS. 10A-10D. In FIG. 10A, each data point indicates the flow rate (Q) and pressure head (AP) generated by the ALD KP-1.2 with a specific input power. The data exhibits a linear compromise between the flow rate and pressure head. Similar plots were also obtained from the ALD KP-24 (FIG. 10B) and ALD KP-96 (FIG. 10C). The highest flow rate measured in these experiments was about 211 sccm. This was obtained from the ALD KP-96 with an input power of 37 W and a pressure head of 90 Pa. Projecting along the Q-AP line, the KP-96 was expected to produce a flow rate of about 290 sccm at zero pressure head. The maximum blocking pressures created by the ALD KPs were in the rage of 350-400 Pa. Although increasing the input power is expected to increase the output flow and pressure further, these tests were not attempted in order to prevent potential damage from overheating. In an ongoing lifetime test, the ALD KP-24 devices have operated continuously for over 10,000 hours, during which the flow rate gradually reduced by about 19% from the initial value (FIG. 10D). The decrease in the flow rate was likely caused by dust accumulation at the pump inlet, where no filter was used.

Figure 11A:
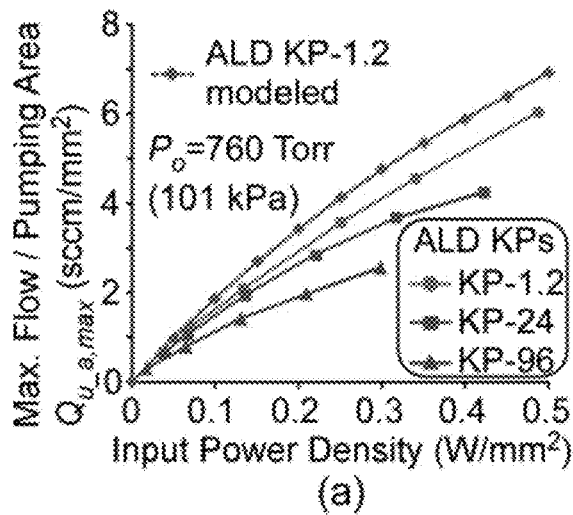
FIGS. 11A-11D illustrate experimental results of Knudsen pumps: (a) and (b) ALD KPs, and (c) and (d) ONO KPs, as operated near atmospheric pressure, where the Knudsen pump output flow rate (Q) and input power are normalized to the pumping area ($A_{pumping}$), $\Delta P_{eq} = \Delta P|_{Q=0}$, and $Q_{u\_a,max} = (Q/A_{pumping})|_{\Delta P=0}$.
Figure 11B:
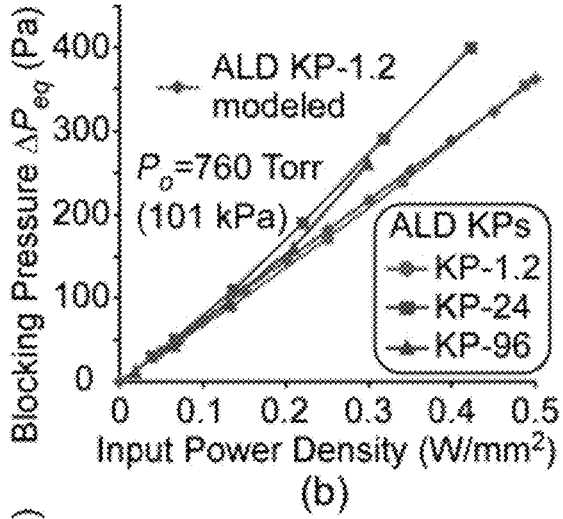
Figure 11C:
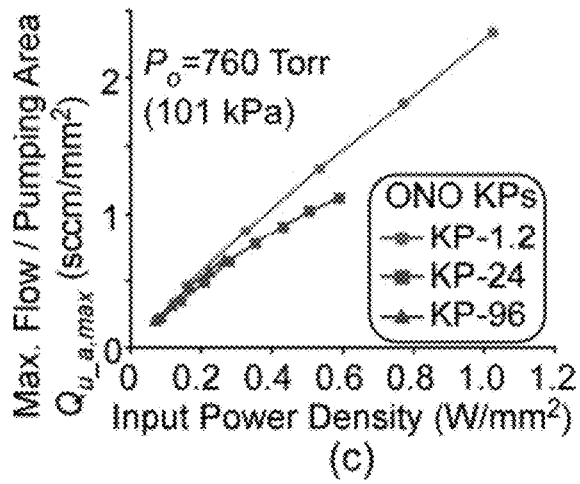
Figure 11D:
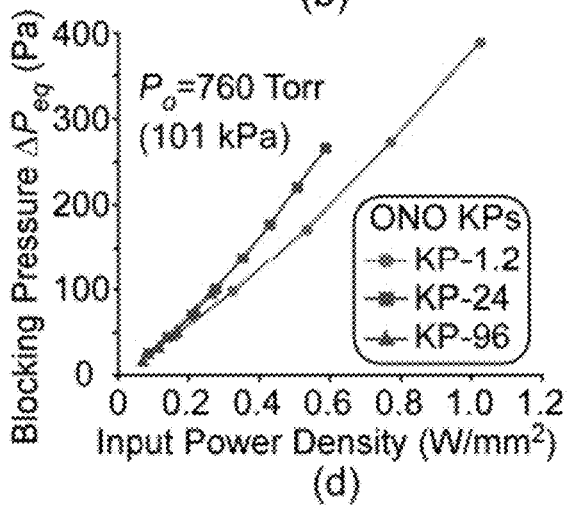

As evident from FIG. 11A, at a given areal power density, the ALD KP-1.2 provided higher maximum flow rate per pumping area and lower blocking pressure than the ALD KP-24 and ALD KP-96. This was likely caused by the variations in the temperature distribution between the three designs. Possible variations in the loading presented in the test setup may have also played a role. The modeling results of the ALD KP-1.2, as described above, are also plotted in FIG. 11A. These results match the experimental results with less than 15% discrepancy. The normalized performance of the ONO KPs is plotted in FIG. 11B. The same overall trend is evident: at a given power density, the ONO KP-1.2 provided higher maximum flow rate per pumping area and lower blocking pressure than the ONO KP-24 and ONO KP-96. However, the performance of the ONO KPs was lower than that of the ALD KPs. With the same power density, the ALD KPs produced 5× in the maximum flow rate per pumping area and 2× in the blocking pressure compared to the ONO KPs. The lower performance of the ONO KPs may be due in part to the higher heat conduction through the 100 nm-thick ONO sidewalls, as well as some imperfections in the fabricated structures.

Figure 12A:
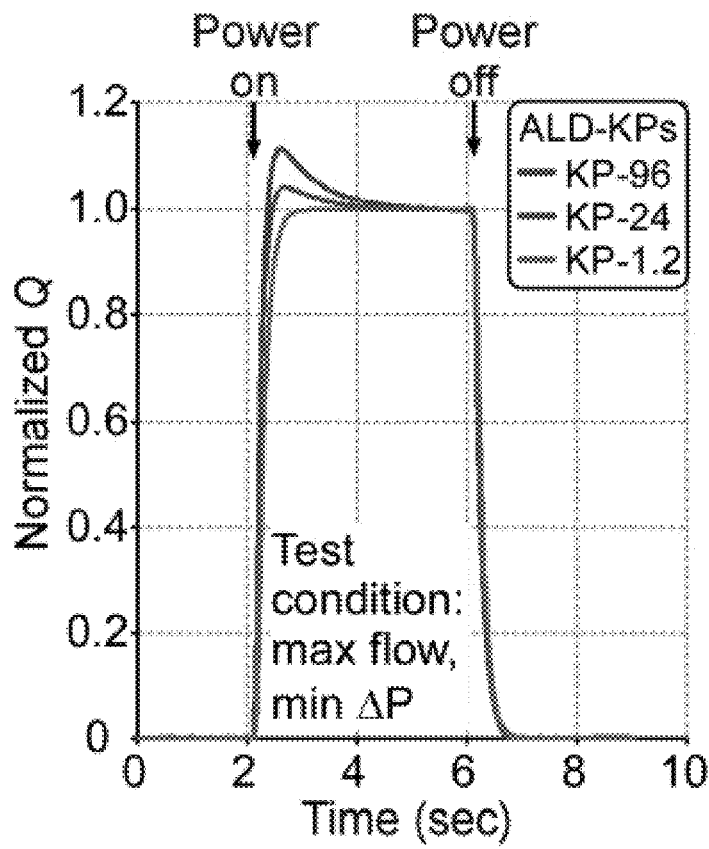
FIGS. 12A-12B include measured transient responses of flow and pressure head generated by various Knudsen pump designs near atmospheric pressure, where the transient flow and pressure head are normalized to the steady-state magnitudes.
Figure 12B:
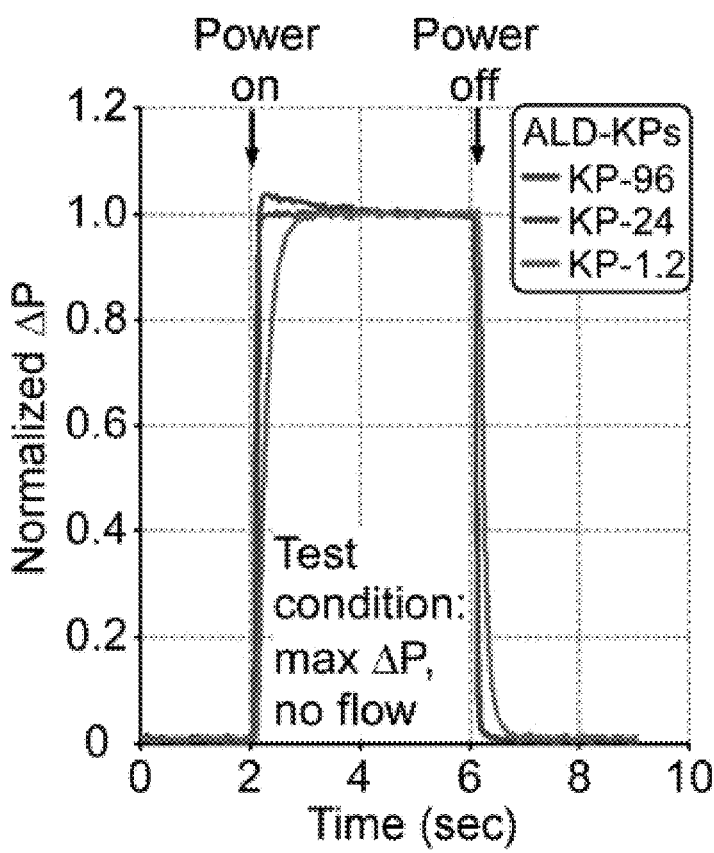

The transient flow and pressure head responses of the ALD KPs were also measured by switching the input power. The transient flow responses were obtained under the condition of maximum measurable flow, i.e., no extra tubular loading. The transient AP responses were obtained under the maximum-AP condition, i.e., gas flow being fully blocked. After the input power was turned on or off, the ALD KPs showed <0.5 sec. response time for reaching 90% of the steady state values (FIGS. 12A-12B). This response rate is ~20× faster than previously reported Knudsen pumps. Since the measured response time was the aggregate of both the thermal response time of the Knudsen pump itself and the fluidic response time of the test setup, faster response can be expected with reduced dead volume in the test setup.

The performance of the Knudsen pumps operated in vacuum was evaluated by the measured time-dependent pressure head response. The volume flow rate response can be calculated from the mass transfer rate of air molecules being withdrawn from the bottle, which in turn can be calculated from the measured transient pressure head response, using the following equations:

$$Q = \frac{1}{\rho_{std}} \cdot \frac{dm_{air}}{dt} = \frac{M_{air}}{\rho_{std}} \cdot \frac{dn}{dt} \tag{5}$$

where $m_{air}$ and n are the mass and number of moles of air molecules withdrawn in time period t, respectively; $\rho_{std}$ is the air density at standard conditions; and $M_{air}$ is the molar mass of air. With the application of the ideal gas law, the volume air flow rate can be expressed as:

$$Q = \frac{M_{air}}{\rho_{std}} \cdot \frac{V}{R \cdot T} \cdot \frac{dP}{dt} \tag{6}$$

where V is the total volume of air being evacuated (which is mainly contributed by the fixed-volume bottle), R is the universal gas constant, T is the ambient temperature, and P is the pressure of air of air being evacuated. Numerically, $$\frac{dP}{dt}$$

is equal to $$\frac{d\Delta P}{dt}.$$

Figure 13A:
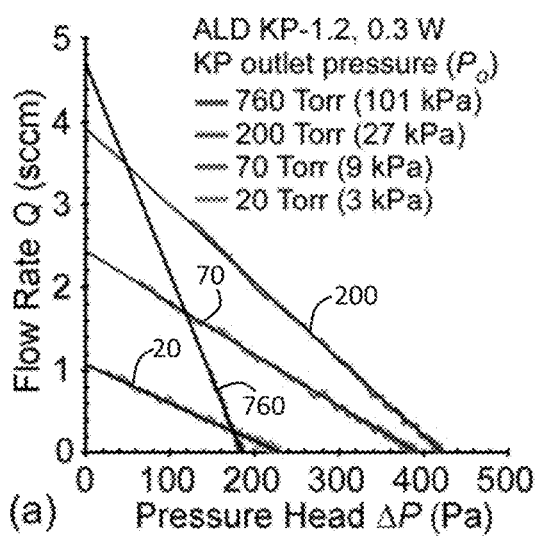
FIGS. 13A-13D illustrate measured performance of Knudsen pumps operated in vacuum, including: (a) flow rate-pressure head relationships of ALD KP-1.2; (b) variations of the blocking pressure ($\Delta P_{eq}$) and maximum flow rate ($Q_{max}$) of the ALD KP-1.2 with its outlet pressure, where $\Delta P_{eq} = \Delta P|_{Q=0}$ and $Q_{max} = Q|_{\Delta P=0}$; (c) flow rate-pressure head relationships of ONO KP-1.2; and (d) variations of the blocking pressure ($\Delta P_{eq}$) and maximum flow rate ($Q_{max}$) of the ONO KP-1.2 with its outlet pressure.
Figure 13B:
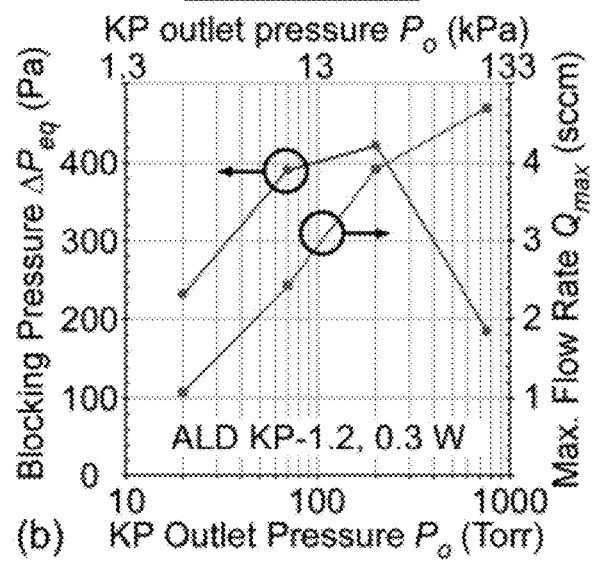
Figure 13C:
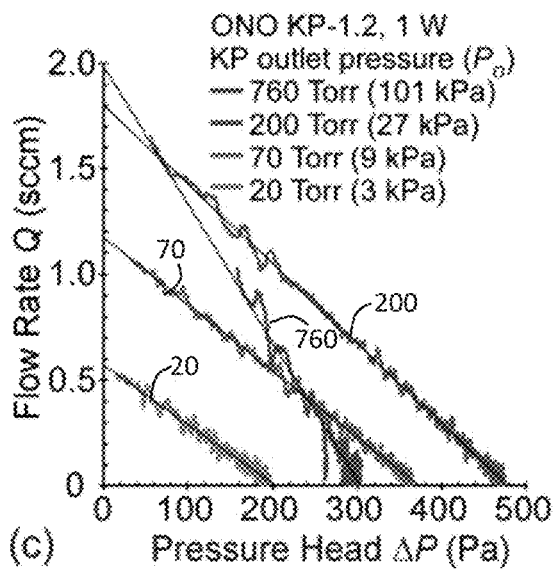
Figure 13D:
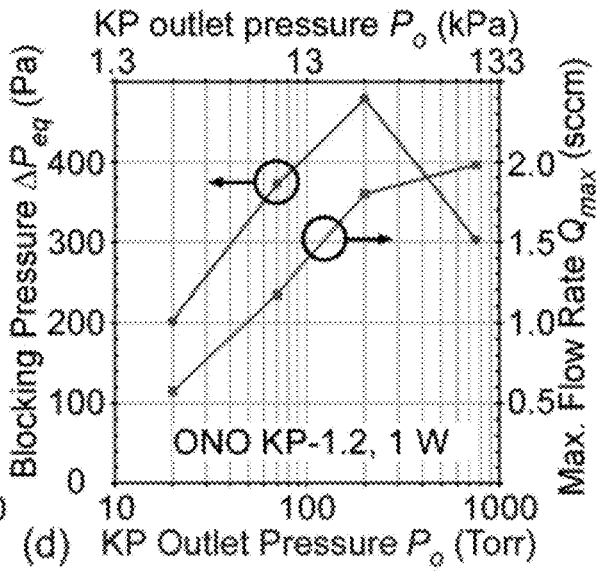

As the Knudsen pumps demonstrated rapid response of less than 0.5 seconds, which was much shorter than the approximately 50 second duration of the time-dependent experiment, the Knudsen pumps were assumed to reach quasi-steady-state operation during the experiment (i.e., the Knudsen pumps reached steady state within each observation interval). Therefore, the measured pressure head and calculated flow rate at each time interval could be used directly to indicate the performance of the Knudsen pumps operated in vacuum. As shown in FIGS. 13A-13D, the measured pressure head response and the corresponding flow response present a linear relationship. To verify this method, the responses of the Knudsen pumps operated at atmospheric pressure were also evaluated by time-dependent measurements. This response matched that obtained using a flow meter directly. The measured flow vs. pressure responses of the ALD KP-1.2 at various ambient pressures (20, 70, 200, and 760 Torr) are shown in FIG. 13A. It is evident from FIG. 13B that the ALD KP-1.2 provided increasing output flow rate with increasing ambient pressure, but the blocking pressure was highest at an ambient pressure of about 200 Torr. A similar trend can also be observed from the response of the ONO KP-1.2 (FIG. 13C and FIG. 13D). Considering both the output flow rate and blocking pressure, the fabricated Knudsen pumps described here were most amenable for operation at about 200 Torr (i.e., $P_o=200$ Torr).

The Knudsen pumps described and fabricated by way of example above demonstrate a measured maximum flow rate per pumping area among the highest of known micropumps, and about 200× higher than other Knudsen pumps. Additionally, these Knudsen pumps are about 20× faster than prior Knudsen pumps, due in part to the low thermal mass in the heating zone.

It is instructive to consider the fundamental performance constraints that might be imposed by an ideal Knudsen pump structure that includes only the vertical gas flow channels (a/b/l=2/120/20 μm). It is assumed that a temperature gradient can be applied along the channels without any lateral power dissipation. It is also assumed that none of the channels are blocked by a membrane as in practice. If the channels have infinitesimal sidewall thickness (i.e., 100% of power dissipates through air), a power density of 0.2 W/mm² can generate a maximum flow rate per pumping area of 21 sccm/mm². If the channels have 10 nm-thick $Al_2O_3$ sidewalls, the same power density can generate a maximum flow rate per pumping area of 16 sccm/mm² because of a lower temperature gradient (see Table III).

TABLE III

| Assuming input power = 0.2 W/mm² | Ideal structure (0 nm sidewall) | Ideal structure (10 nm sidewall) | ALDKP-1.2 (modeled) | ALD KP-1.2 (tested) |
| --- | --- | --- | --- | --- |
| ΔT (K) | 133 | 100 | 62 | NA |
| $\Delta P_{eq}$ (Pa) | 396 | 290 | 179 | 137 |
| $Q_{u-a, max}$ (sccm/mm²) | 21 | 16 | 4.3 | 2.9 |

This means that the 10 nm-thick $Al_2O_3$ sidewalls reduce the performance of the ideal structure with zero sidewall thickness by 24%. The actual designed structure further reduces the performance, resulting in a maximum flow rate per unit pumping area that is only 14-20% of that provided by the ideal structure with infinitesimal sidewalls thickness and no blocked channels.

The gas flow channels have a width of 2 μm, resulting in a Knudsen number Kn of ≈0.04 at atmospheric pressure. This favors a high flow rate but reduces the blocking pressure. Nevertheless, such a dimension is more amenable to pump operation in partial vacuum where the mean free path of air molecules is comparable to the channel width. In addition, gas at vacuum pressures has lower thermal conductivity, which reduces the power consumption of the Knudsen pump. For example, as demonstrated by the results in FIG. 13A, the ALD KP-1.2 operated at an ambient pressure of about 200 Torr provided twice blocking pressure with only 15% reduction in the maximum flow rate per pumping area as compared to that operated at atmospheric pressure. Therefore, the channel dimensions implemented in this effort are suitable for use in tandem with a roughing pump (e.g. a diaphragm actuation-based micropump) to generate both vacuum and high flow rate simultaneously.

The 2 μm channel width in the experimental examples above was selected in part because the lithography and DRIE processes place constraints on further downscaling in the channel width. If desirable, the pumps can be designed to increase the blocking pressure even for operation at atmospheric pressure. By calculation, it can be shown that if the Knudsen pump were fabricated with 1 μm-wide channels with 5 nm-thick $Al_2O_3$ sidewalls, the blocking pressure would be tripled while the flow rate would only be reduced by 10% with the same input power at atmospheric pressure.

Many potential applications are contemplated for the above-described gas flow structure. For example, a multi-stage Knudsen pump can be configured, which provides smaller flow rate and higher pressure head for micro gas chromatographs and mass spectrometers. Additionally, the fast response provides promise in applications that requires rapid flow switching.

Described below is additional modeling and fabrication of stacked multi-stage Knudsen pumps. In the stacking of the above-described Knudsen pumps, spacers are used to isolate the heated region of one pump from the heat sink of an adjacent pump. Thermal modeling of the stacked Knudsen pump structure provides insights into the spacer design. Spacers have been fabricated and assembled into stacked Knudsen pumps.

The spacers in the stacked KP structure may be in the form of Si frames. Si has high thermal conductivity and can provide efficient heat sinking for the upper stages. The frames can be designed to have an opening in the center that is slightly larger than the pumping area in each Knudsen pump stage. This facilitates the gas flow from the lower stages into the upper stages.

Figure 14A:
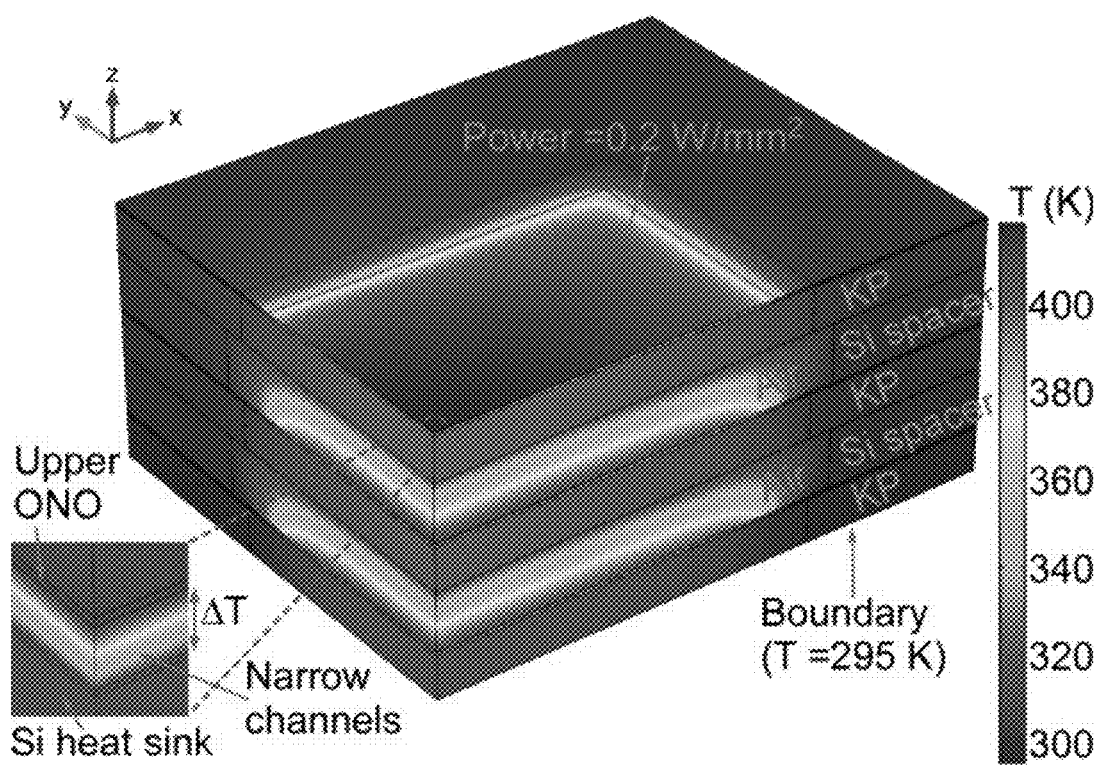
FIGS. 14A-14B illustrate results from a FEA of overall temperature distribution in a one quarter model of an illustrative stacked Knudsen pump structure, including: (a) a 3D temperature profile of a stack of three ALD KP-24s with 500 μm Si spacers between adjacent pumps, and (b) average temperatures of inlet and outlet ends of the gas flow channels for different values of spacer height.
Figure 14B:
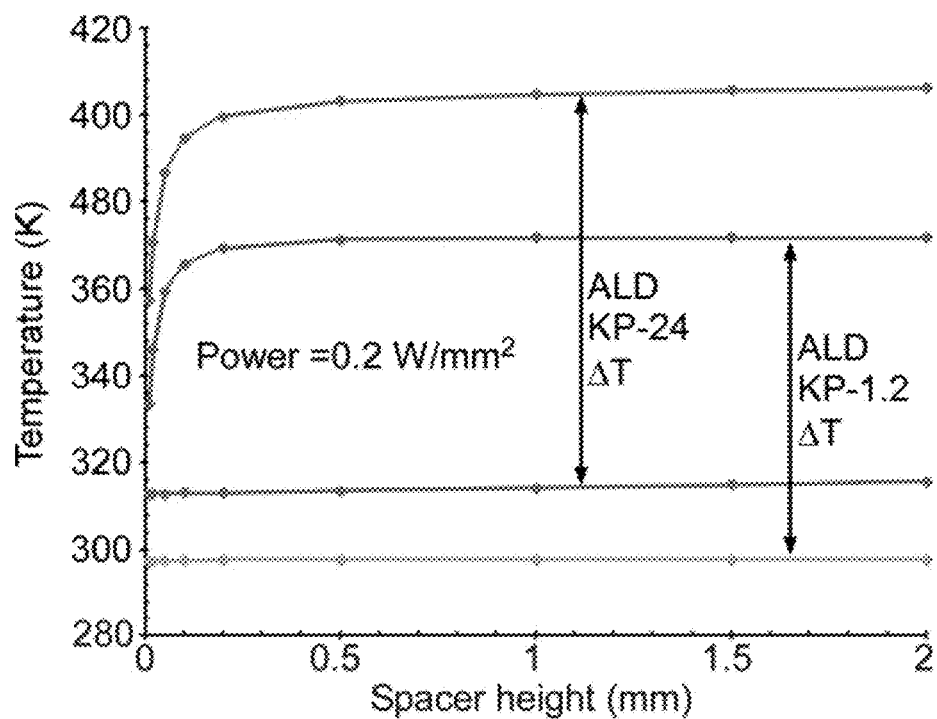

Modeling was used to study the temperature distribution in a stacked Knudsen pump structure (FIGS. 14A-14B). From the 3D temperature profile of FIG. 14A, it is evident that the Si spacers are able to provide sufficient heat sinking, as the rims of the upper stages remain at room temperature while the centers are heated. The requirements of the spacer height were also studied as shown in FIG. 14B. If the spacer height is less than 50 μm (i.e., the heated region of the lower stage is less than 50 μm away from the bottom of the upper stage), the temperature of the heated region of the lower stage drops drastically. To provide sufficient thermal isolation, a spacer height of greater than 200 μm may be preferred.

The spacers were microfabricated by using deep reactive ion etching (DRIE) to etch through a 500 μm-thick Si wafer. Next, the spacers were coated with a 10 nm-thick ALD $Al_2O_3$ layer. The $Al_2O_3$ layer protects the Si spacers from the $XeF_2$ etchant, which is the last fabrication step described in the pump fabrication above, and provides electrical insulation.

Figures 15A, 15B:
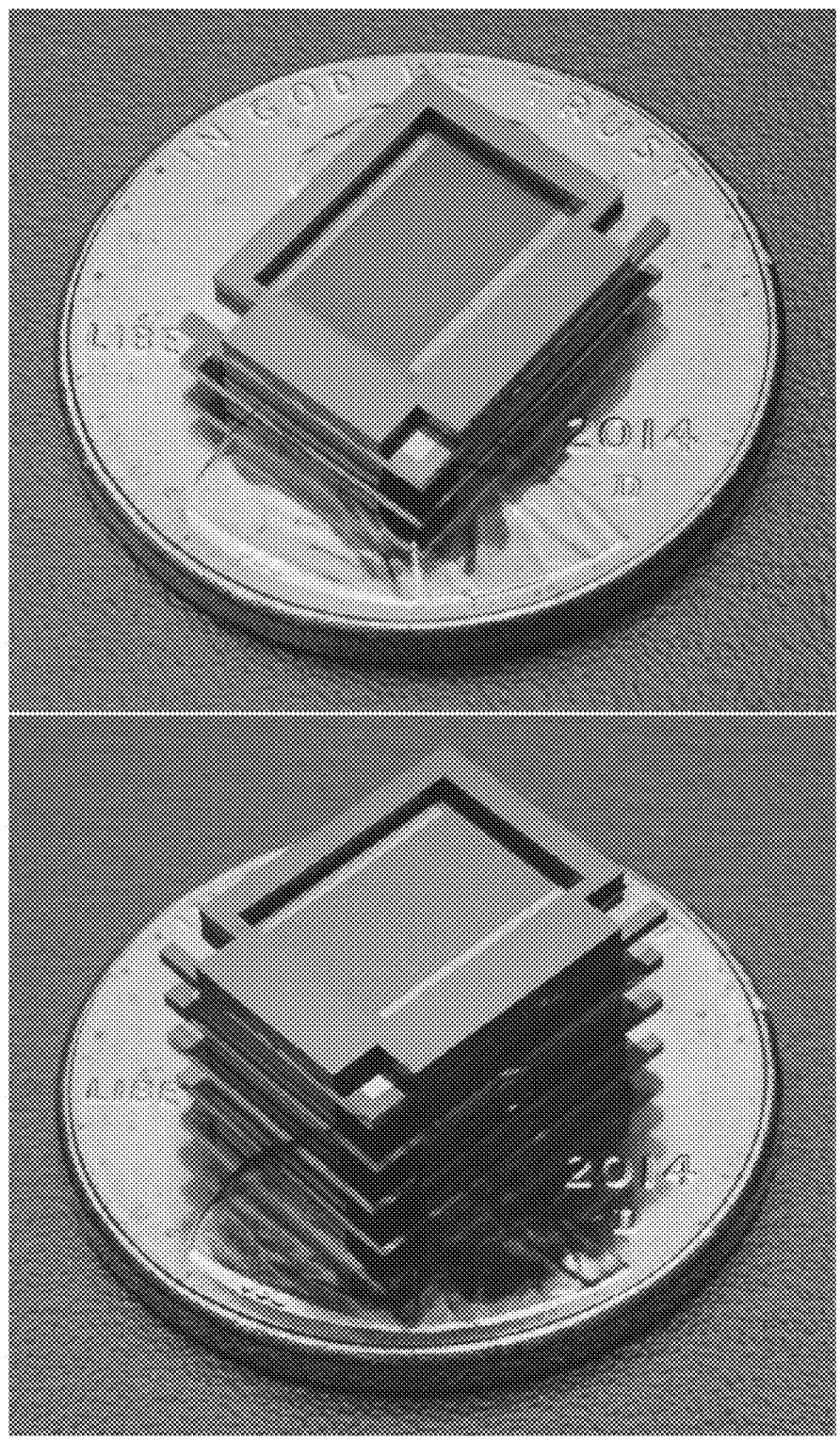
FIGS. 15A-15B include photographs of stacked Knudsen pumps, including: (a) a 2-stage ALD KP-24 pump with 1 mm spacing between stages, and (b) a 4-stage ALD KP-24 pump.

Considering both the modeling results and the ease of stack assembly, two Si spacers were used between every two Knudsen pump stages, in one example. An epoxy or wax layer was applied between the spacers and the Knudsen pump stages to prevent leakage. Sample photos of the stacked Knudsen pumps are shown in FIGS. 15A-15B. A 2-stage ALD KP-24 has a form factor of 10×8×3 mm$^3$. A 4-stage ALD KP-24 has a form factor of 10×8×6 mm$^3$.

Experimental evaluation of the stacked multi-stage Knudsen pumps is described below. Compared to the single-stage Knudsen pumps, the multi-stage pumps provide higher pressure head and equal flow rate at a given power density (i.e., power per unit pumping area), but care must be taken with regard to pump overheating.

Figure 16A:
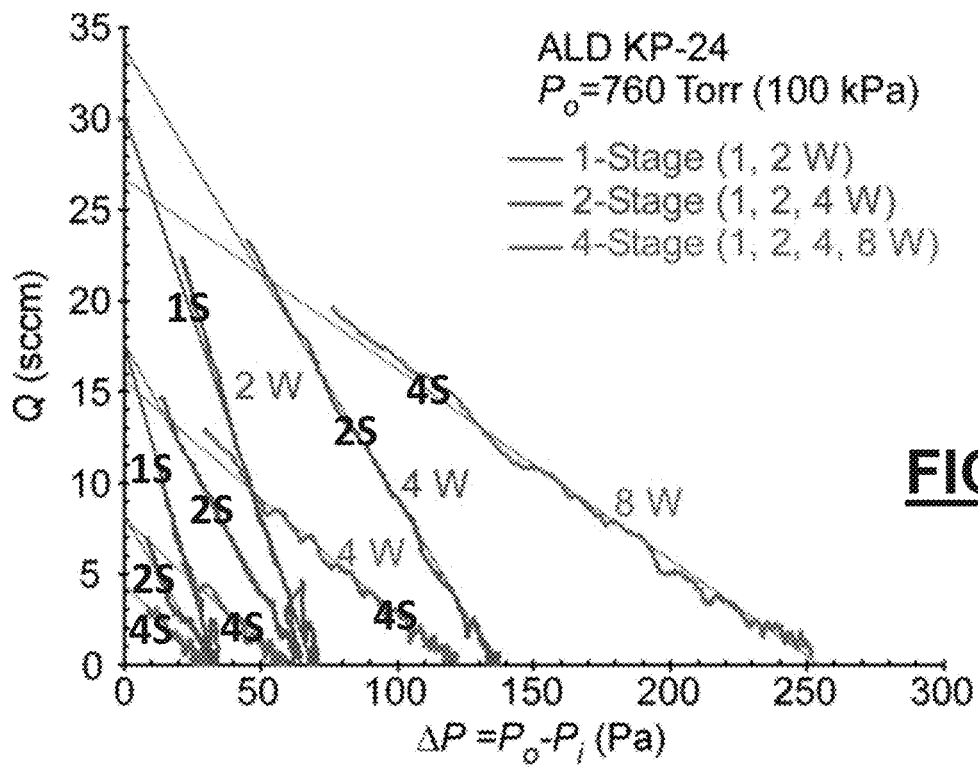
FIGS. 16A-16C illustrate the performance of single-stage, 2-stage, and 4-stage Knudsen pumps at (a) 760 Torr, (b) 200 Torr, and (c) 70 Torr, at various input powers.
Figure 16B:
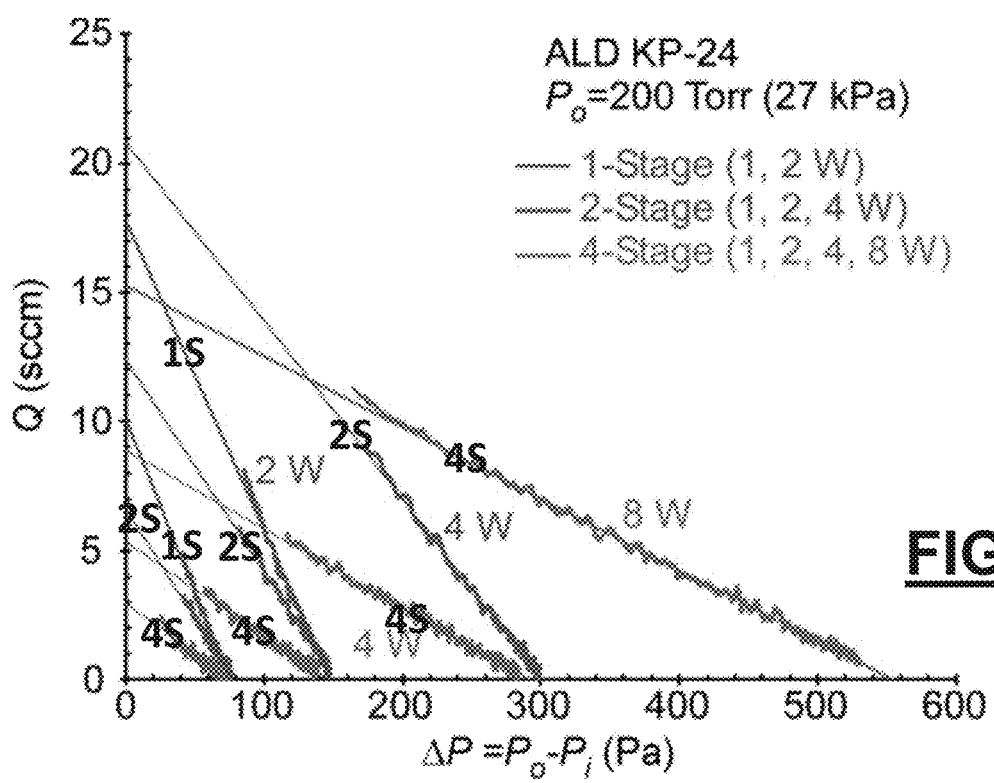
Figure 16C:
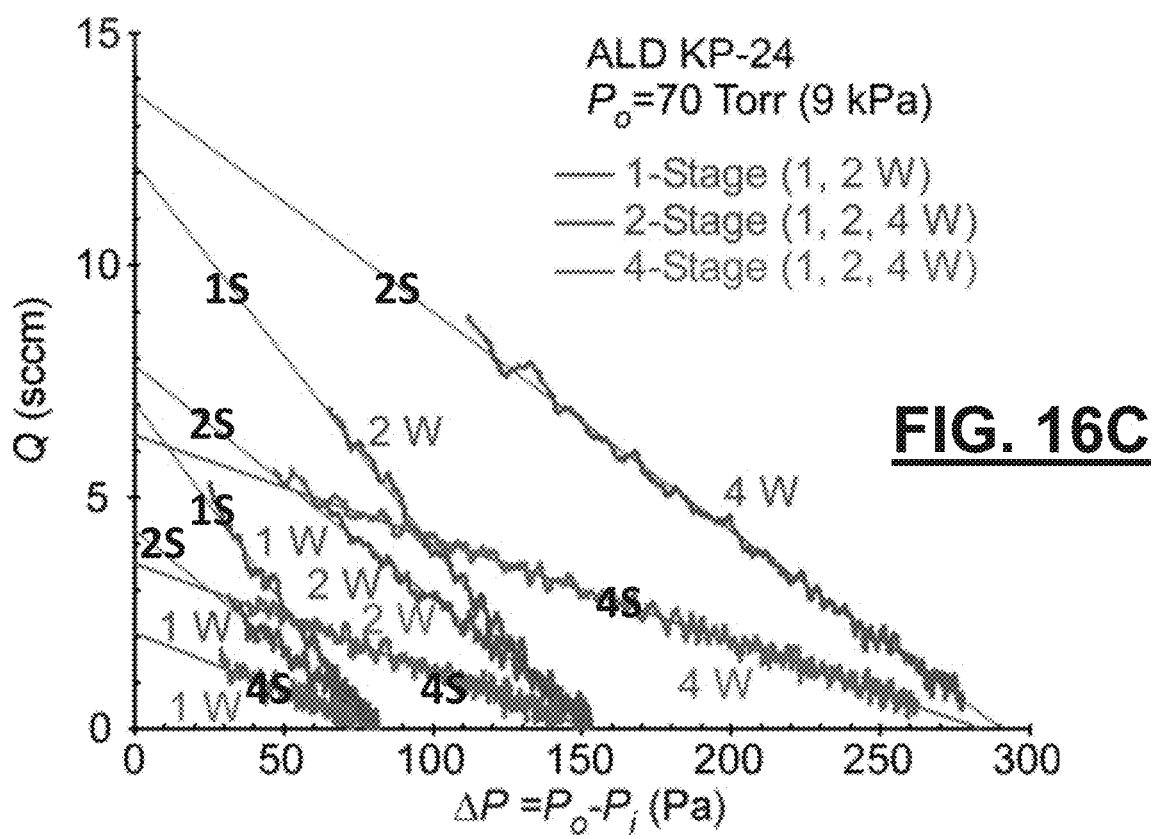

The performance of 1, 2, and 4-stage Knudsen pumps (ALD KP-24s) have been evaluated at 760 Torr, 200 Torr, and 70 Torr (FIGS. 16A-16C, respectively). In principle, compared to a one-stage KP with a given power, an n-stage Knudsen pump with n times power will provide n times blocking pressure and the same maximum flow. For example, a 1-stage Knudsen pump with 2 W power, a 2-stage Knudsen pump with 4 W power, and a 4-stage Knudsen pump with 8 W power should produce the same maximum flow and blocking pressure in 1:2:4 ratio. As observed from the results, the 1-stage ALD KP-24 with 2 W power, 2-stage ALD KP-24 with 4 W power, and 4-stage ALD KP-24 with 8 W power provide comparable maximum flow (Q), and blocking pressure ($\Delta P|_{Q=0}$) in the ratio of ≈1:2:3.7.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A method of microfabricating a gas flow structure comprising an array of gas flow channels supported between first and second support layers at opposite inlet and outlet ends of the gas flow channels, the method comprising the steps of:
   (a) forming trenches in a substrate at desired locations of some of the gas flow channels such that unremoved substrate material remains between the trenches at desired locations of more of the gas flow channels;
   (b) forming a layer of dielectric material along walls of the trenches such that portions of the dielectric material face each other across each trench;
   (c) filling each trench with an etchable material;
   (d) removing, after step (c), the substrate material remaining between the trenches such that each of said portions of dielectric material forms a wall shared by adjacent gas flow channels of the array;
   (e) forming one or more heat sink channels in the first support layer such that the etchable material is exposed in the formed heat sink channels;
   (f) coating walls of the formed heat sink channels with an etch-resistant material; and
   (g) etching the etchable material from between the walls of each trench, wherein the etch-resistant material prevents the first support layer from being etched.

2. The method of claim 1, further comprising the step of forming a heat source supported by the second support layer at the outlet end of the gas flow channels.

3. The method of claim 1, wherein the substrate is a multi-layer wafer comprising a device layer and a handle layer separated by a dielectric layer, the gas flow channels being formed in the device layer.

4. The method of claim 1, wherein the substrate is a multi-layer wafer comprising a device layer and a handle layer separated by a dielectric layer, the first support layer being formed from the handle layer.

5. The method of claim 1, wherein the gas flow channels are formed in a device layer of a silicon-on-insulator (SOI) wafer, and the first support layer is formed from a handle layer of the SOI wafer.

6. The method of claim 1, further comprising the step of:
   removing at least a portion of a bottom wall of each trench after step (b) to form the inlet end of the gas flow channels.

7. The method of claim 1, wherein step (b) comprises atomic layer deposition and/or wherein the dielectric material is $Al_2O_3$.

8. The method of claim 1, wherein the step of coating comprises atomic layer deposition of $Al_2O_3$ on the walls of each heat sink channel, the method further comprising reactive ion etching of each heat sink channel, whereby the $Al_2O_3$ is removed from a bottom wall of each heat sink channel but not from opposing walls of each heat sink channel.

9. A microfabricated gas flow structure, comprising:
   a plurality of parallel walls extending in a gas flow direction between opposite first and second ends, wherein each wall is made from a dielectric material;
   a first support layer configured to support the plurality of parallel walls at the first end, the first support layer having one or more gas inlet openings formed therethrough; and
   a second support layer configured to support the plurality of parallel walls at the second end, the second support layer having one or more gas outlet openings formed therethrough,
   wherein the plurality of parallel walls is arranged to define an array of hollow channels extending in the gas flow direction between the first and second ends, each hollow channel of the array being separated from an adjacent hollow channel of the array by one of the plurality of parallel walls such that opposite sides of each wall are exposed to separate adjacent hollow channels,
   wherein the array of hollow channels fluidly connects the one or more gas inlet openings with the one or more gas outlet openings in an active pumping area of the gas flow structure,
   wherein the array of hollow channels defines a thermal isolation zone circumscribing the active pumping area, the hollow channels of the thermal isolation zone being closed off prevent gas flow therethrough, and wherein each hollow channel of the array is sized for flow in the non-viscous flow regime in the gas flow direction between an inlet side and an outlet side of the structure, whereby, in the presence of a temperature differential across the inlet and outlet ends, gas flows into the structure through the first support layer in the flow direction, through the array of hollow channels in the flow direction, and out of the structure through the second support layer in the flow direction.

10. The gas flow structure of claim 9, further comprising a heat source supported by the second support layer at the outlet side of the structure, the heat source being operable to induce gas flow through the array of hollow channels in the active pumping area, whereby the microfabricated gas flow structure is a Knudsen pump.

11. The gas flow structure of claim 10, wherein the heat source is a thin film resistive heater comprising resistive portions located between adjacent gas outlet openings.

12. The gas flow structure of claim 10, further comprising a second gas pump fluidly connected with the gas flow structure in a serial flow arrangement to form a gas micropump.

13. The gas flow structure of claim 12, wherein the second gas pump is constructed according to claim 10.

14. The gas flow structure of claim 9, wherein each wall has a thickness at least an order of magnitude less than the distance across at least one of the hollow channels the wall separates.

15. The gas flow structure of claim 9, wherein the hollow channels of the thermal isolation zone are blocked by the second support layer.

16. The gas flow structure of claim 9, wherein at least 20% of the active pumping area is open area not occupied by the second support layer or walls between adjacent hollow channels.

17. The gas flow structure of claim 9, wherein the array of hollow channels has a cross-sectional area, and a percentage of the cross-sectional area occupied by walls between adjacent hollow channels is greater than zero and less than or equal to 10.

18. The gas flow structure of claim 17, wherein the percentage is greater than zero and less than or equal to 1.

19. The gas flow structure of claim 9, wherein the dielectric material is $Al_2O_3$.

* * * * *